United States Patent
Lee

(10) Patent No.: US 12,142,555 B2
(45) Date of Patent: Nov. 12, 2024

(54) SUBSTRATE EMPLOYING VERTICAL CONDUCTOR LOOPS FOR COUPLING NOISE REDUCTION IN RADIO-FREQUENCY (RF) TRANSMISSION LINES, AND RELATED ANTENNA MODULES AND FABRICATION METHODS

(71) Applicant: QUALCOMM Incorporated, San Diego, CA (US)

(72) Inventor: Hong-Ming Lee, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 160 days.

(21) Appl. No.: 18/170,612

(22) Filed: Feb. 17, 2023

(65) Prior Publication Data

US 2024/0282688 A1    Aug. 22, 2024

(51) Int. Cl.
  *H01Q 1/52* (2006.01)
  *H01L 23/498* (2006.01)
  *H01Q 1/22* (2006.01)

(52) U.S. Cl.
  CPC ......... *H01L 23/49838* (2013.01); *H01Q 1/22* (2013.01); *H01Q 1/52* (2013.01)

(58) Field of Classification Search
  CPC ...... H01L 23/49838; H01Q 1/22; H01Q 1/52; H05K 2201/097; H05K 2201/10098; H05K 1/0228; H05K 1/165; H05K 1/0219; H01P 3/085
  See application file for complete search history.

(56) References Cited

U.S. PATENT DOCUMENTS

| | | | |
|---|---|---|---|
| 10,779,402 B1* | 9/2020 | Ng | H05K 1/0216 |
| 2012/0319908 A1* | 12/2012 | Tsutsumi | H01Q 1/243 |
| | | | 343/702 |

FOREIGN PATENT DOCUMENTS

| | | |
|---|---|---|
| EP | 2549586 A1 | 1/2013 |
| JP | 6142933 B1 | 6/2017 |

OTHER PUBLICATIONS

International Search Report and Written Opinion for International Patent Application No. PCT/US2024/014215, mailed May 29, 2024, 13 pages.

* cited by examiner

*Primary Examiner* — David E Lotter
(74) *Attorney, Agent, or Firm* — Withrow + Terranova, PLLC

(57) ABSTRACT

Antenna module substrate employing vertical conductor loops for coupling noise reduction in radio-frequency (RF) transmission lines, and related antenna modules and fabrication methods. To provide effective electrical isolation between closely routed RF transmission lines in a metallization layer of the substrate, vertical conductor loops are formed in a metallization layer(s) adjacent to the RF transmission lines. The magnetic flux loop generated by the RF transmission lines as a result of carrying RF signals penetrates through the opening of the adjacent vertical loop structures, thereby inducing a magnetic field in the vertical conductor loops in the opposite direction of the magnetic flux. The induced magnetic field in the vertical conductor loops induces eddy currents in the vertical conductor loops, which in turn interferes with the magnetic flux thus causing a magnetic damping force in the magnetic flux, thus reducing or cancelling RF transmission line coupling noise.

28 Claims, 14 Drawing Sheets

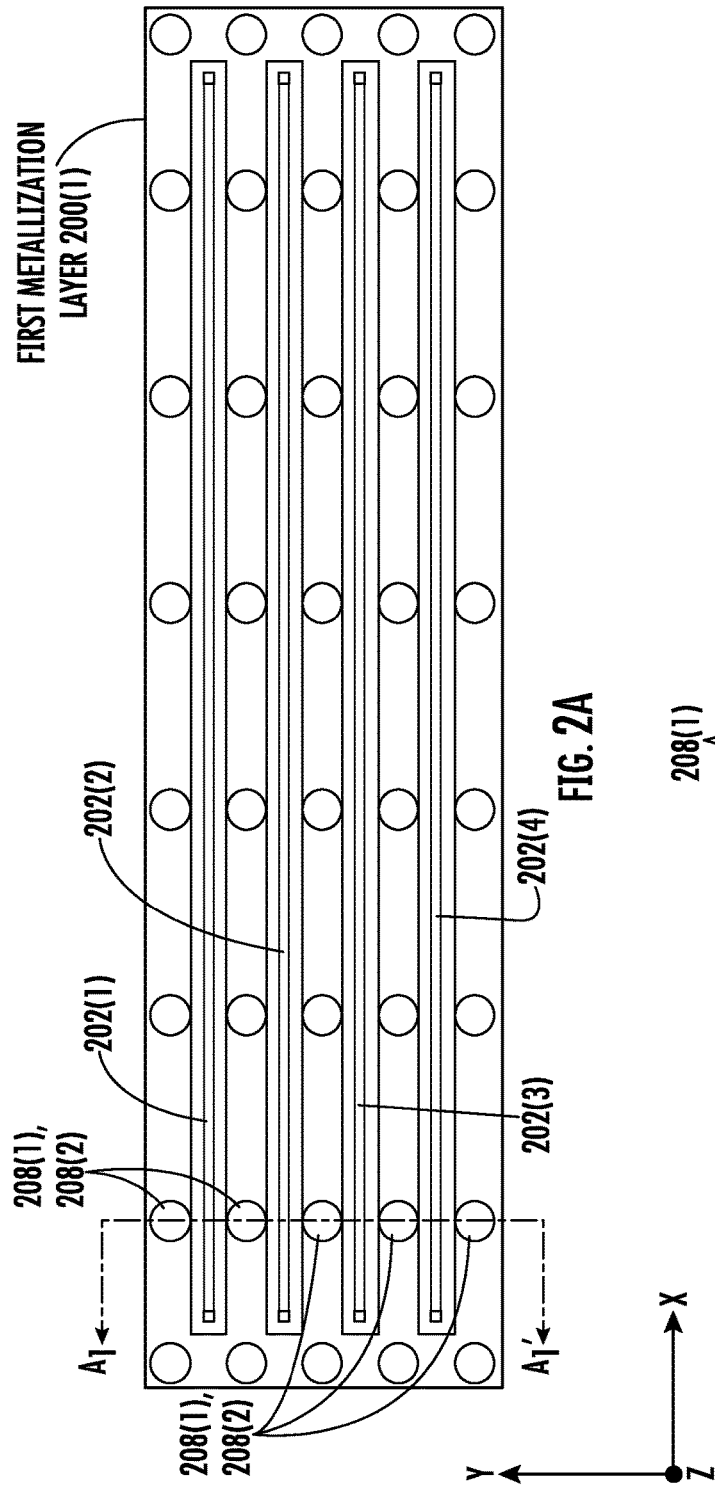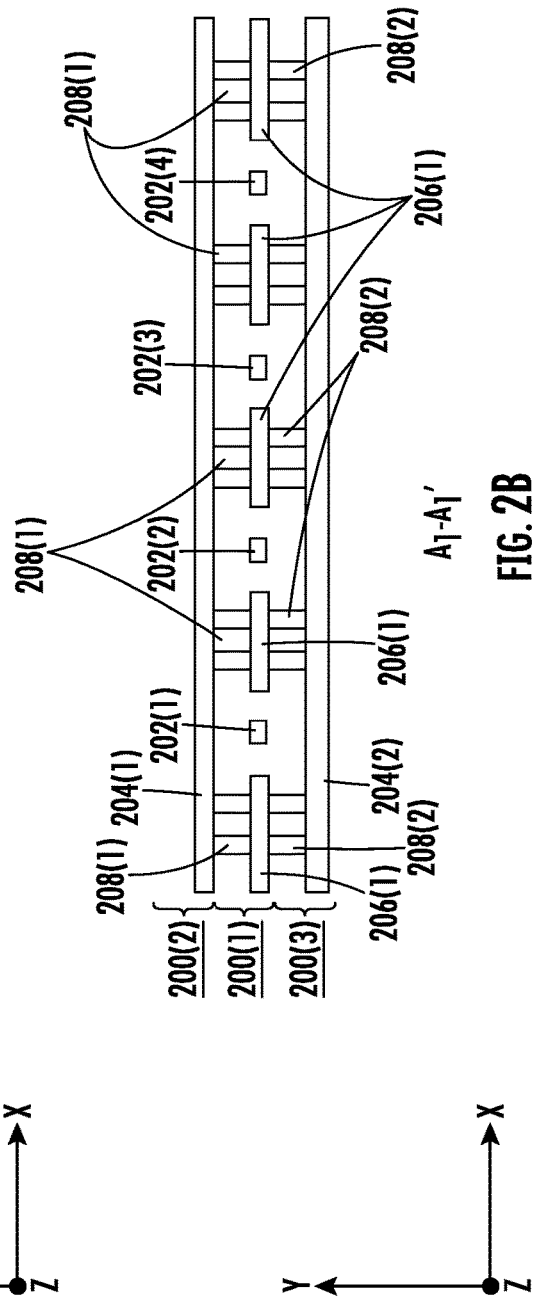

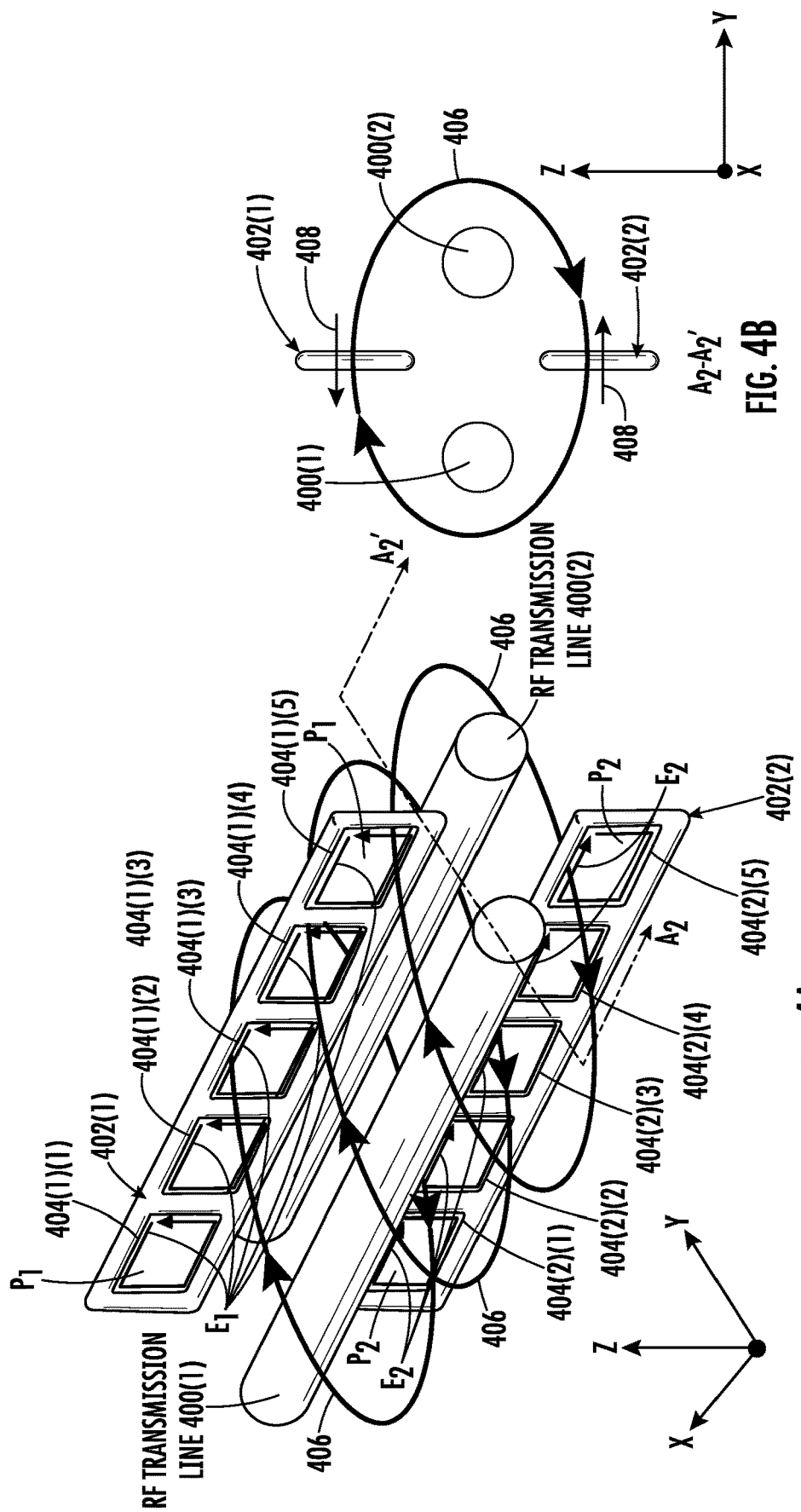

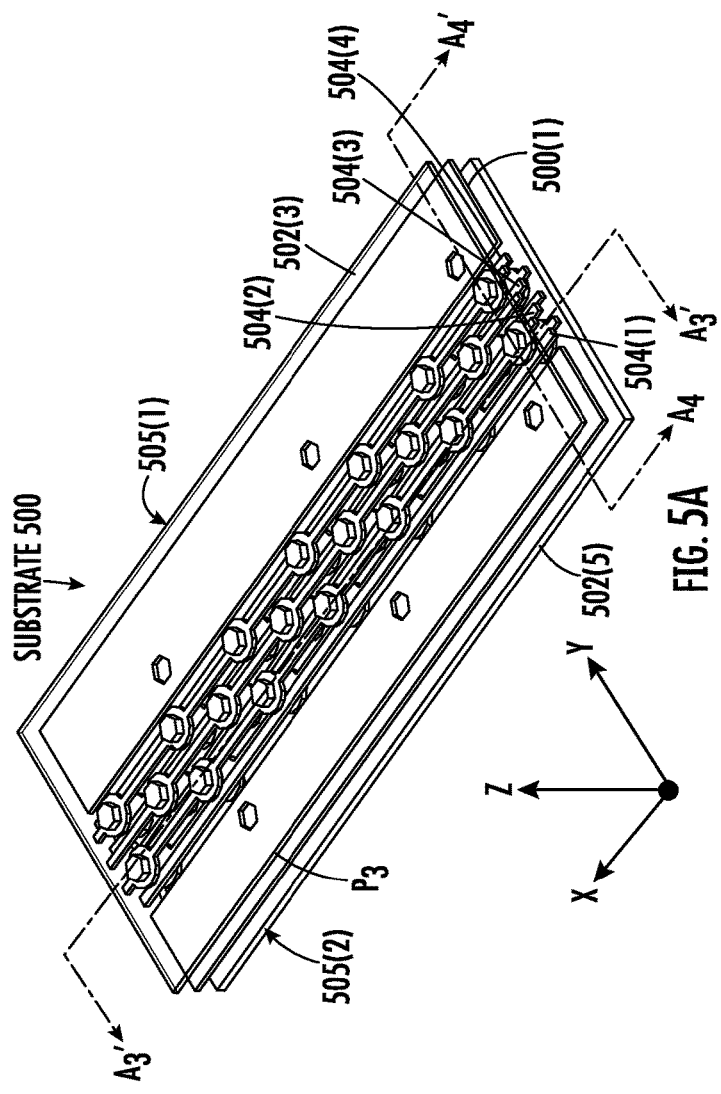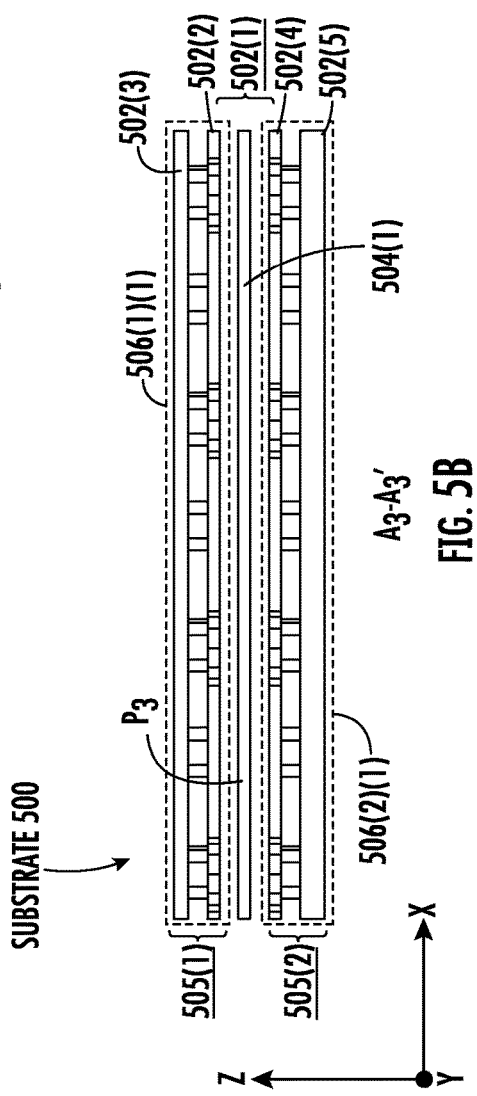
FIG. 5A
FIG. 5B

SUBSTRATE EMPLOYING VERTICAL CONDUCTOR LOOPS FOR COUPLING NOISE REDUCTION IN RADIO-FREQUENCY (RF) TRANSMISSION LINES, AND RELATED ANTENNA MODULES AND FABRICATION METHODS

BACKGROUND

I. Field of the Disclosure

The field of the disclosure relates to antenna modules (also referred to as "antenna-in-packages" (AiP(s)) that include a radio-frequency (RF) integrated circuit (IC) (RFIC) coupled to an antenna(s) through an antenna module substrate.

II. Background

Modern smart phones and other portable devices have extended the use of different wireless links with a variety of technologies in different radio frequency bands. For example, fifth generation (5G) cellular networks, commonly referred to as 5G new radio (NR), include frequencies in the range of 24.25 to 86 Gigahertz (GHz), with the lower 19.25 GHZ (24.25-43.5 GHZ) more likely to be used for mobile devices. This frequency spectrum of 5G communications is in the range of millimeter wave (mmWave) or millimeter band. mmWave enables higher data rates than at lower frequencies, such as those used for Wi-Fi and current cellular networks.

Radio-frequency (RF) transceivers that support mmWave spectrum are incorporated into mobile and other portable devices that are designed to support mm Wave communications signals. To support the integration of a RF transceiver in a device, the RF transceiver can be integrated in an RF integrated circuit (IC) (RFIC) in a RFIC chip that is provided as part of an antenna module. The RFIC chip is realized in a RFIC semiconductor die ("die"). An antenna module may also be referred to as an "antenna-in-package" (AiP). A conventional antenna module includes a RFIC package that includes one or more RFICs, a power management IC (PMIC), and passive electrical components (e.g., inductors, capacitors, etc.) mounted to an antenna module substrate (e.g., a package substrate) as a support and signal routing structure. The RFIC(s) include a RF signal transmitter and receiver capable of modulating RF signals to be transmitted in a supported frequency band(s) and demodulating received RF signals in a supported frequency band(s). The antenna module substrate supports metallization structures to provide chip-to-chip and external signal interfaces to the RFIC package. The antenna module substrate also includes a metallization layers(s) (that may be included in or a separate substrate from a package substrate) that includes one or more antennas that are electrically coupled to the RFIC package through the metallization structures of the package substrate. The antennas are capable of receiving and radiating electrical RF signals as electromagnetic (EM) signals. The antenna module substrate may include a plurality of antennas, also referred to an antenna array, to provide a signal coverage in a desired, larger area around the antenna module.

To provide RF signal feed lines between the RFIC(s) and the antennas in the antenna module, the antenna module substrate of the antenna module includes RF signal transmission lines ("RF transmission lines"). The RF transmission lines are formed in the antenna module substrate to provide RF signal routing paths between the RFICs and the antennas. If the RF transmission lines are located close enough to each other in the antenna module substrate for efficient routing, the conduction of the RF signals in the RF transmission lines can create electro-magnetic waves that can induce current on an adjacent RF transmission line(s) as "noise." Thus, in antenna modules, it is conventional to provide some type of isolation feature between RF transmission lines to prevent or reduce noise. For example, ground planes may be formed in the antenna module substrate that surround the RF transmission lines. Ground planes can be formed in adjacent metallization layers above and below the metallization layer of RF transmission lines with vertical via connections being disposed between the RF transmission lines connecting to the top and bottom adjacent ground planes to effectively surround the RF transmission lines with ground planes for isolation.

SUMMARY OF THE DISCLOSURE

Aspects disclosed in the detailed description include substrate employing vertical conductor loops for coupling noise reduction in radio-frequency (RF) transmission lines. Related antenna modules and fabrication methods are also disclosed. The substrate can be an antenna module substrate included in an antenna module as a package substrate or separate antenna substrate. The substrate includes one or more metallization layers for providing signal routing between a RF integrated circuit(s) (RFIC(s)) in the antenna module. The substrate can also include antenna elements in one or more metallization layers that serve as antennas for the antenna module. RF transmission lines are formed in the package substrate to route RF signals from the RFICs to the antennas. As antenna modules are reduced in package size, it may become necessary or desired to provide more efficient signal routing in the substrate where RF transmission lines are routed, physically located closer to each other in a given metallization layer. This more efficient routing may not provide sufficient lateral spacing between adjacent RF transmission lines to form ground plane connections between adjacent RF transmission lines to electrically isolate the RF transmission lines to prevent or reduce coupling noise between adjacent RF transmission lines. Thus, in exemplary aspects, to provide effective electrical isolation between adjacent and more closely routed located RF transmission lines in a metallization layer of the substrate, vertical conductor loops are formed in one or more adjacent metallization layers adjacent to the RF transmission lines. The vertical conductor loops are formed in metallization layers adjacent to (e.g., vertically above and/or below) the metallization layer of the RF transmission lines. The vertical conductor loops can be coupled to ground planes in their respective metallization layers. In this manner, the magnetic flux loop, generated by the RF transmission lines as a result of carrying RF signals, penetrates through the opening of the adjacent vertical loop structures, thereby inducing a magnetic field in the vertical conductor loops in the opposite direction of the magnetic field. The induced magnetic field in the vertical conductor loops induces eddy currents in the vertical conductor loops, which in turn interferes with the magnetic field, thus causing a magnetic damping force in the magnetic field. This reduces or cancels the magnetic flux of the magnetic field generated by the RF transmission lines, thus reducing or cancelling coupling noise induced by one RF transmission line to an adjacent RF transmission line.

In this manner, as an example, the magnetic field from one RF transmission line being induced in an adjacent RF transmission line and creating a coupling noise in the adjacent RF transmission line is reduced or canceled. This reduction or cancellation in coupling noise does not require providing a ground plane connection laterally between the adjacent transmission lines in their metallization layer, which would otherwise require lateral space between adjacent transmission lines sufficient to provide this ground plane connection. Providing this ground plane connection may not allow the RF transmission lines to be spaced closer together and with a reduced pitch as desired. However, with the vertical conductor loops being displaced vertically in adjacent metallization layers with respect to the RF transmission lines, sufficient coupling noise reduction and/or cancellation may still be achieved, but with the ability to provide a reduced pitch and spacing between adjacent RF transmission lines in the substrate.

In this regard, in one exemplary aspect, a substrate is provided. The substrate comprises a first metallization layer in a first plane, the first metallization layer comprising a first RF transmission line extending in a first direction in the first plane, and a second RF transmission line adjacent to the first RF transmission line. The substrate also comprises a plurality of second metallization layers parallel to the first metallization layer. The plurality of second metallization layers comprises a first conductor loop structure adjacent to the first RF transmission line and the second RF transmission line. The first conductor loop structure comprises one or more first conductor loops each in a second plane orthogonal to the first plane. The substrate also comprises a plurality of third metallization layers parallel to the first metallization layer, wherein the first metallization layer is between the plurality of second metallization layers and the plurality of third metallization layers in a second direction orthogonal to the first plane. The plurality of third metallization layers comprises a second conductor loop structure adjacent to the first RF transmission line and the second RF transmission line, the second conductor loop structure comprising one or more second conductor loops each in a third plane orthogonal to the first plane.

In another exemplary aspect, a method of fabricating a substrate is provided. The method comprises forming a first metallization layer in a first plane. The method also comprises forming a first RF transmission line in the first metallization layer extending in a first direction in the first plane. The method also comprises forming a second RF transmission line in the first metallization layer adjacent to the first RF transmission line. The method also comprises forming a plurality of second metallization layers parallel to the first metallization layer. The method also comprises forming a first conductor loop structure adjacent in the plurality of second metallization layers to the first RF transmission line and the second RF transmission line, the first conductor loop structure comprising one or more first conductor loops each in a second plane orthogonal to the first plane. The method also comprises forming a plurality of third metallization layers parallel to the first metallization layer wherein the first metallization layer is between the plurality of second metallization layers and the plurality of third metallization layers in a second direction orthogonal to the first plane. The method also comprises forming a second conductor loop structure in the plurality of third metallization layers adjacent to the first RF transmission line and the second RF transmission line, the second conductor loop structure comprising one or more second conductor loops each in a third plane orthogonal to the first plane.

In another exemplary aspect, an antenna module is provided. The antenna module comprises a substrate comprising an antenna substrate comprising one or more antennas, and a package substrate coupled to the antenna substrate. The antenna module also comprises an integrated circuit (IC) die layer comprising a first die comprising a plurality of first die interconnects coupled to the package substrate. The substrate comprises a first metallization layer in a first plane and comprising a first RF transmission line extending in a first direction in the first plane, the first RF transmission line coupled to a first antenna of the one or more antennas, and a second RF transmission line adjacent to the first RF transmission line, the second RF transmission line coupled to a second antenna of the one or more antennas. The substrate also comprises a plurality of second metallization layers parallel to the first metallization layer and comprising a first conductor loop structure adjacent to the first RF transmission line and the second RF transmission line, the first conductor loop structure comprising one or more first conductor loops each in a second plane orthogonal to the first plane. The substrate also comprises a plurality of third metallization layers parallel to the first metallization layer wherein the first metallization layer is between the plurality of second metallization layers and the plurality of third metallization layers in a second direction orthogonal to the first plane. The plurality of third metallization layers comprises a second conductor loop structure adjacent to the first RF transmission line and the second RF transmission line, the second conductor loop structure comprising one or more second conductor. The plurality of first die interconnects coupled to the first RF transmission line and the second RF transmission line.

BRIEF DESCRIPTION OF THE FIGURES

FIGS. 2A and 2B are top and cross-sectional side views, respectively, of an exemplary metallization layer that can be provided in the substrate in the antenna module in FIG. 1 with exemplary routed RF transmission lines;

FIGS. 4A and 4B are perspective and cross-sectional side views, respectively, of RF transmission lines routed through a metallization layer in a substrate, with vertical conductor loops formed vertically above and below the RF transmission lines in respective upper and lower metallization layers, wherein the vertical conductor loops are configured to be penetrated by magnetic flux loops generated by the RF transmission lines, thereby inducing a magnetic field and eddy currents in the vertical conductor loops, interfering with the magnetic field thus causing a magnetic damping force in the magnetic field to reduce or cancel the magnetic field generated by the RF transmission lines;

FIGS. 5A-5C are perspective, cross-sectional side, and cross-sectional front views, respectively of another substrate that can be included in an antenna module, including the antenna module in FIG. 1, that includes RF transmission lines routed in a first metallization layer, and upper and lower metallization layers with vertical conductor loops formed therein and to the RF transmission lines to reduce or cancel the magnetic field generated by the RF transmission lines;

DETAILED DESCRIPTION

Figure 1:
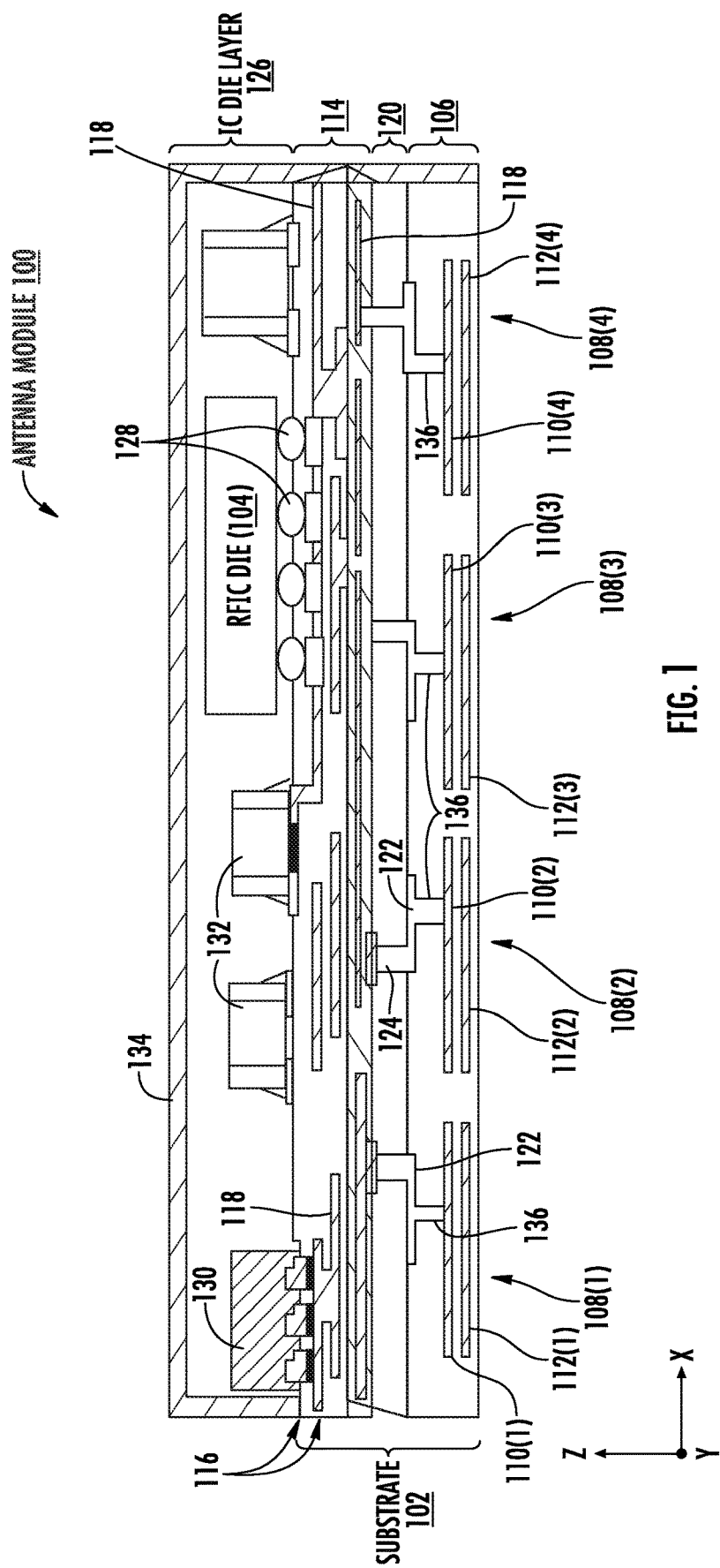
FIG. 1 is a side view of an exemplary antenna module that includes a substrate supporting antennas formed in metallization layers of the substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include substrate employing vertical conductor loops for coupling noise reduction in radio-frequency (RF) transmission lines. Related antenna modules and fabrication methods are also disclosed. The substrate can be an antenna module substrate included in an antenna module as a package substrate or separate antenna substrate. The substrate includes one or more metallization layers for providing signal routing between a RF integrated circuit(s) (RFIC(s)) in the antenna module. The substrate can also include antenna elements in one or more metallization layers that serve as antennas for the antenna module. RF transmission lines are formed in the package substrate to route RF signals from the RFICs to the antennas. As antenna modules are reduced in package size, it may become necessary or desired to provide more efficient signal routing in the substrate where RF transmission lines are routed, physically located closer to each other in a given metallization layer. This more efficient routing may not provide sufficient lateral spacing between adjacent RF transmission lines to form ground plane connections between adjacent RF transmission lines to electrically isolate the RF transmission lines to prevent or reduce coupling noise between RF transmission lines. Thus, in exemplary aspects, to provide effective electrical isolation between adjacent and more closely routed located RF transmission lines in a metallization layer of the substrate, vertical conductor loops are formed in one or more metallization layers adjacent to the RF transmission lines. The vertical conductor loops are formed in metallization layers adjacent to (e.g., vertically above and/or below) the metallization layer of the RF transmission lines. The vertical conductor loops can be coupled to ground planes in their respective metallization layers. In this manner, the magnetic flux loop, generated by the RF transmission lines as a result of carrying RF signals, penetrates through the opening of the vertical loop structures, thereby inducing a magnetic field in the vertical conductor loops in the opposite direction of the magnetic field. The induced magnetic field in the vertical conductor loops induces eddy currents in the vertical conductor loops, which in turn interferes with the magnetic field, thus causing a magnetic damping force in the magnetic field. This reduces or cancels the magnetic field generated by the RF transmission lines, thus reducing or cancelling coupling noise induced by one RF transmission line to an adjacent RF transmission line.

In this manner, as an example, the magnetic field from one RF transmission line being induced in an adjacent RF transmission line and creating a coupling noise in the adjacent RF transmission line is reduced or canceled. This reduction or cancellation in coupling noise does not require providing a ground plane connection laterally between the adjacent transmission lines in their metallization layer, which would otherwise require lateral space between adjacent transmission lines sufficient to provide this ground plane connection. Providing this ground plane connection may not allow the RF transmission lines to be spaced closer together and with a reduced pitch as desired. However, with the vertical conductor loops being displaced vertically in adjacent metallization layers with respect to the RF transmission lines, sufficient coupling noise reduction and/or cancellation may still be achieved, but with the ability to provide a reduced pitch and spacing between adjacent RF transmission lines in the substrate.

Figure 3:
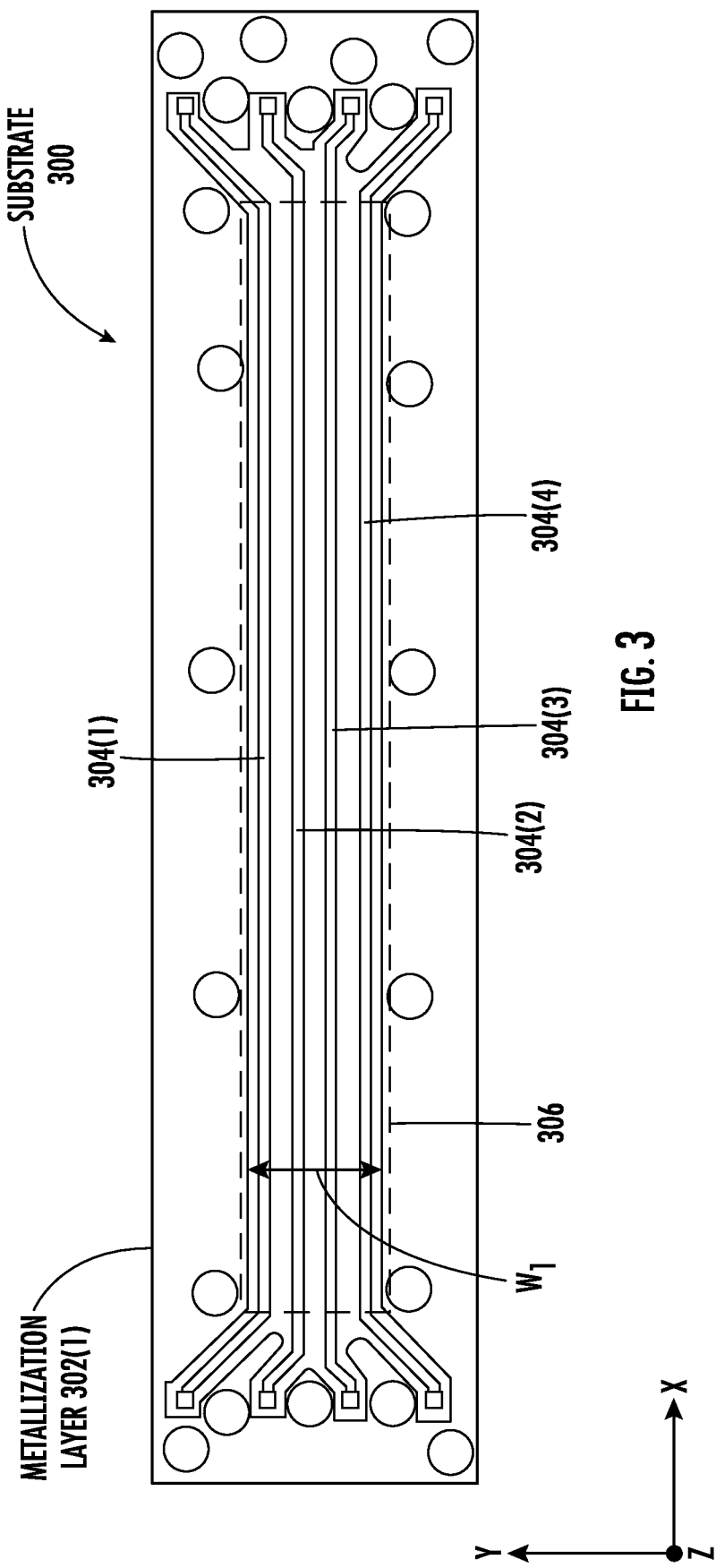
FIG. 3 is a top view of an exemplary portion of the substrate that can be included in an antenna module, including the antenna module in FIG. 1, with RF transmission lines routed in a metallization layer with reduced spacing between the RF transmission lines.

Before discussing examples of substrate employing vertical conductor loops for coupling noise reduction in RF transmission lines starting at FIG. 4, an exemplary antenna module and exemplary RF transmission lines routed in a metallization layer than can be provided in a substrate of the antenna module is first discussed with regard to FIGS. 1-3 below.

In this regard, FIG. 1 is a view of an exemplary antenna module 100 that is a RFIC package that is configured in a side-by-side arrangement. The antenna module 100 includes a substrate 102 that supports signal routing between a RFIC die 104 mounted to the substrate 102. The substrate 102 may be a package substrate. The substrate 102 includes an antenna substrate 106 that includes four (4) antennas 108(1)-108(4) that each include respective first antenna elements 110(1)-110(4) and second antenna elements 112(1)-112(4). The substrate 102 also includes a package substrate 114 that includes a plurality of metallization layers 116 that each include metal interconnects 118 for routing signals between the RFIC die 104 and the antennas 108(1)-108(4). The substrate 102 also includes a core substrate 120 disposed between the package substrate 114 and the antenna substrate 106 for increased firmness and stability of the antenna module 100. The core substrate 120 also includes metal interconnects 122 that are coupled to metal interconnects 118 in the package substrate 114 and the first antenna elements 110(1)-110(4) in the antenna substrate 106 through vias 124 to provide signal routing paths between the package substrate 114 and the antenna substrate 106.

The antenna module 100 also includes an IC die layer 126 disposed in a horizontal plane (X-axis and Y-axis direction plane) and that includes the RFIC die 104 that includes a semiconductor die that includes an encapsulated RF transceiver. The RFIC die 104 is coupled to the substrate 102 through its die interconnects 128 that are coupled to metal interconnects 118 in the package substrate 114. The antenna module 100 could also include a separate adjacent power management IC (PMIC) die 130 that provides a power source for the RFIC die 104. The RFIC die 104 and PMIC die 130 are arranged in a side-by-side arrangement in a horizontal direction (X-axis direction). The IC die layer 126 also includes other passive components 132 (e.g., capacitors, inductors) that are electrically coupled through the substrate 102 to the RFIC die 104 and/or the PMIC die 130 as part of the circuits formed therein. An electromagnetic interference (EMI) shield 134 is disposed around the RFIC die 104 and other components in the IC die layer 126 to provide RF shielding of these components.

With continuing reference to FIG. 1, each antenna 108(1)-108(4) is a patch antenna that includes the antennal elements 110(1)-110(4) adjacent to the core substrate 120 and second antenna elements 112(1)-112(4) in the form of metal patches) disposed below the respective first antenna elements 110(1)-110(4) in the vertical direction (Z-axis direction). The antenna elements 110(1)-110(4) are coupled to the RFIC die 104 through vias 136 and the metal interconnects 122, 118, acting as RF transmission lines to feed RF signals to and from the antennas 108(1)-108(4). The second antenna elements 112(1)-112(4) are not in contact with the first antenna elements 110(1)-110(4), but are configured to be electro-magnetically (EM) coupled to the first antenna elements 110(1)-110(4) when the first antenna elements 110(1)-110(4) receive a RF signal to be radiated. Similarly, when the second antenna elements 112(1)-112(4) are energized by a received RF signal, the second antenna elements 112(1)-112(4) are EM coupled to the first antenna elements 110(1)-110(4) with the received RF signal.

FIGS. 2A and 2B are top and side views, respectively, of an exemplary first, second, and third metallization layers 200(1)-200(3) that can be provided in a substrate in an antenna module, such as the antenna module 100 in FIG. 1. In this example, the first metallization layer 200(1) has exemplary four (4) routed RF transmission lines 202(1)-202(4) extending in a first direction (X-axis direction) and parallel to each other. FIG. 2A illustrates a top view of the first metallization layer 200(1). FIG. 2B illustrates a side view of first, second, and third metallization layers 200(1)-200(3) across the A1-A1' cross-section line shown in FIG. 2B, which shows the first metallization layer 200(1) in which the RF transmission lines 202(1)-202(4) are disposed, adjacent to and between the second and third metallization layers 200(2), 200(3) in the second, vertical direction (Z-axis direction) orthogonal to the first direction (X-axis direction).

The conduction of the RF signals in the RF transmission lines 202(1)-202(4) in the first metallization layer 200(1) create EM waves that induce current on an adjacent RF transmission line(s) as "noise" that may not be desired as negatively affecting RF performance. Thus, in this example, the RF transmission lines 202(1)-202(4) are each surrounded by ground planes 204(1), 204(2) in a vertical direction (Z-axis direction) formed in respective second and third metallization layers 200(2), 200(3). However, the ground planes 204(1), 204(2) alone do no isolate the RF transmission lines 202(1)-202(4) to each other in a lateral direction within their first metallization layer 200(1). To isolate the RF transmission lines 202(1)-202(4) laterally from each other in the third direction (Y-axis direction), metal interconnects 206(1) that are adjacent and between each of the RF transmission lines 202(1)-202(4) are coupled to the ground planes 204(1), 204(2) through respective vias 208(1), 208(2) which effectively disposes the ground planes 204(1), 204(2) on each side of the RF transmission lines 202(1)-202(4) to isolate them from each other.

However, it may be desired to reduce the size of an antenna module, such as the antenna module 100 in FIG. 1. Reducing the size of the antenna module may necessarily mean a reduction in the size of its substrate. This may require the RF transmission lines in the reduced size substrate to be routed in a smaller area in the substrate, thus requiring the RF transmission lines to be located closer together with a reduced line/spacing (L/S) metal pattern and pitch. This is shown by example in FIG. 3. FIG. 3 is a top view of an exemplary portion of the substrate 300 that can be included in an antenna module, including the antenna module 100 in FIG. 1. The substrate 300 includes a first metallization layer 302(1) that also has four (4) RF transmission lines 304(1)-304(4) routed therein extending in the first direction (X-axis direction) in parallel with each other. However, as shown in FIG. 3, the RF transmission lines 304(1)-304(4) are still adjacent to each other, but much more closely located to each other than the RF transmission lines 202(1)-202(4) in FIGS. 2A and 2B. The RF transmission lines 304(1)-304(4) are routed in a routing channel 306 that has a width $W_1$ of 310 micrometers (μm). There is not sufficient space between adjacent RF transmission lines 304(1)-304(4) in the third, lateral direction (Y-axis direction) to form vias coupled to metal interconnects from adjacent metallization layers in the first direction (Z-axis direction) to extend the ground plane shielding between the RF transmission lines 304(1)-304(4) to isolate them from each other in the third, lateral direction (Y-axis direction).

By "adjacent" RF transmission lines, it is meant that such RF transmission lines are spatially next to each other or beside each other with some intervening space between the adjacent RF transmission lines. For example, in this example, RF transmission line 302(1) is adjacent to RF transmission line 302(2) with intervening space therebetween. RF transmission line 302(2) is adjacent to both RF transmission line 302(1) and RF transmission line 302(3) with intervening space between the respective RF transmission line 302(2) and RF transmission lines 302(1), 302(3). RF transmission line 302(3) is adjacent to both RF transmission line 302(2) and RF transmission line 302(4) with intervening space between the respective RF transmission line 302(3) and RF transmission lines 302(2), 302(4). RF transmission line 302(4) is adjacent to RF transmission line 302(3) with intervening space between the respective RF transmission line 302(4) and RF transmission line 302(3). These respective adjacent RF transmission lines may be spatially located close enough to each other that EM waves created by the conduction of RF signals in one RF transmission line 302(1)-302(4) create a noise signal in another adjacent RF transmission line 302(1)-302(4). Thus, to still provide effective noise isolation between more closely routed RF transmission lines in a substrate for an antenna module, exemplary aspects disclosed below illustrate substrates that include vertical conductor loops formed in one or more metallization layers in the substrate adjacent to the metallization layer containing the RF transmission lines. The vertical conductor loops can be formed in metallization layers vertically above and/or below the metallization layer of the RF transmission lines and can be coupled to ground planes in their respective metallization layers. The magnetic flux loop generated by the RF transmission lines as a result of carrying RF signals penetrates through the opening of the adjacent vertical loop structures, thereby inducing a magnetic field in the vertical conductor loops in the opposite direction of the magnetic field. The induced magnetic field in the vertical conductor loops induces eddy currents in the vertical conductor loops, which in turn interferes with the magnetic field, thus causing a magnetic damping force in the magnetic field. This reduces or cancels the magnetic field generated by the RF transmission lines thus reducing or cancelling coupling noise induced by one RF transmission line to an adjacent RF transmission line.

This is shown by example in FIGS. 4A and 4B. FIG. 4A is a perspective view of adjacent RF transmission lines 400(1), 400(2) routed a metallization layer (not shown) that would extend in a plane in the X-axis and Y-axis directions in a substrate. FIG. 4B is a side, cross-sectional view of the adjacent RF transmission lines 400(1), 400(2) on the cross-section line $A_2$-$A_2'$ in FIG. 4A. The adjacent RF transmission lines 400(1), 400(2) both extend in a first lateral direction (X-axis direction) and are parallel to each other. In this example, RF transmission line 400(1) is adjacent to RF transmission line 400(2) meaning RF transmission lines 400(1), 400(2) are spatially next to each other or beside each other with some intervening space between them. These respective adjacent RF transmission lines 400(1), 4002(2) may be spatially located close enough to each other that EM waves created by the conduction of RF signals in one RF transmission line 400(1), 400(2) create a noise signal in another respective, adjacent RF transmission line 400(2), 400(1).

With continuing reference to FIGS. 4A and 4B, a first conductor loop structure 402(1) is disposed in another metallization layer (not shown) adjacent to and above the RF transmission lines 400(1), 400(2) in the vertical direction (Z-axis direction). By the first and second conductor loop structures 402(1), 402(2) being "adjacent" to the RF transmission lines 400(1), 400(2), it is meant that the first and second conductor loop structures 402(1), 402(2) are spatially next to or beside the RF transmission lines 400(1), 400(2) with some intervening space between the first and second conductor loop structures 402(1), 402(2) and the RF transmission lines 400(1), 400(2). The first conductor loop structure 402(1) includes a plurality of first conductor loops 404(1)(1)-404(1)(5) that are coupled to each other. Each first conductor loop 404(1)(1)-404(1)(5) is disposed in a first plane $P_1$ that is in the X-axis and Z-axis directions. A second conductor loop structure 402(2) is also disposed in another metallization layer (not shown) adjacent to and below the RF transmission lines 400(1), 400(2) in the vertical direction (Z-axis direction). The second conductor loop structure 402(1) includes a plurality of second conductor loops 404(2)(1)-404(2)(5) that are each coupled to each other. Each second conductor loop 404(2)(1)-404(2)(5) is disposed in a first plane $P_2$ that is in the X-axis and Z-axis directions. With continuing reference to FIGS. 4A and 4B, when a RF transmission line 400(1), 400(2) carries a RF signal, a first magnetic field 406 is generated. The first magnetic field 406 is generated around the RF transmission line 400(1), 400(2) in a clockwise direction shown in FIGS. 4A and 4B in this example, but such is not limiting. A magnetic flux of the first magnetic field 406 passes through the first and second conductor loops 404(1)(1)-404(1)(5), 404(2)(1)-404(2)(5) because of their orientation above and below the RF transmission lines 400(1), 400(2) in the path of the first magnetic field 406. The first and second conductor loop structures 402(1), 402(2) are oriented in this example such that planes $P_1$, $P_2$ of their respective first and second conductor loops 404(1)(1)-404(1)(5), 404(2)(1)-404(2)(5) are normal to the direction of the magnetic flux of the first magnetic field 406 passing through the first and second conductor loops 404(1)(1)-404(1)(5), 404(2)(1)-404(2)(5). In this example, the first and second conductor loop structures 402(1), 402(2) are sufficiently close to the RF transmission lines 400(1), 400(2) such that eddy currents $E_1$, $E_2$ are induced in the first and second conductor loops 404(1)(1)-404(1)(5), 404(2)(1)-404(2)(5). This is, as a result of the magnetic flux of the first magnetic field 406 penetrating the first and second conductor loops 404(1)(1)-404(1)(5), 404(2)(1)-404(2)(5). These eddy currents $E_1$, $E_2$ flowing in the first and second conductor loops 404(1)(1)-404(1)(5), 404(2)(1)-404(2)(5) then create an induced second magnetic field 408 in the opposite direction of the first magnetic field 406, which interferes with the first magnetic field 406 this creating a magnetic damping force in the first magnetic field 406 that either significantly reduces or cancels the first magnetic field 406. This has the effect of reducing or canceling the noise induced into one RF transmission line 400(1), 400(2) by another RF transmission line 400(2), 400(1) carrying a RF signal.

Figure 5C:
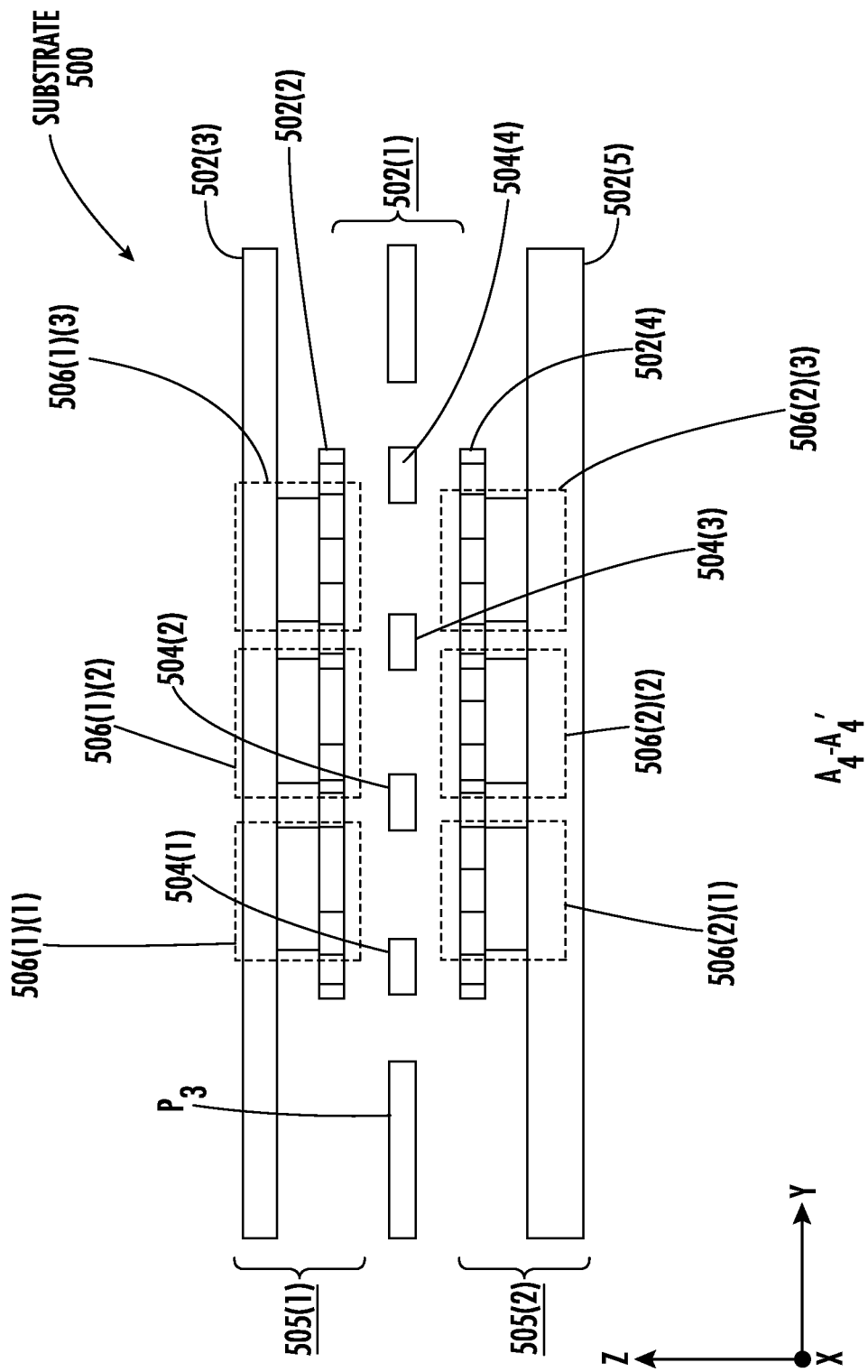

FIGS. 5A-5C are perspective, cross-sectional side, and cross-sectional front views, respectively of another exemplary substrate 500 that can be included in an antenna module, including the antenna module 100 in FIG. 1. The substrate 500 includes a first metallization layer 502(1) that is disposed in a first plane $P_3$ that extends in first and third directions (X-axis and Y-axis directions) that includes four (4) RF transmission lines 504(1)-504(4). The first metallization layer 502(1) could be a core substrate layer such that the substrate 500 is a cored substrate. Alternatively, the substrate 500 could be a coreless substrate. The RF transmission lines 504(1)-504(4) each extend adjacent to each other in the first direction (X-axis direction) in the first plane $P_3$ and are parallel to each other in this example. As non-limiting examples, the RF transmission lines 504(1)-504(4) may be only spaced apart by 40-60 μm, and have a pitch less than 100 μm such as between 65-85 μm. In this this regard, in this example, RF transmission line 504(1) is adjacent to RF transmission line 504(2) with intervening space therebetween. RF transmission line 504(2) is adjacent to both RF transmission line 504(1) and RF transmission line 504(3) with intervening space between the respective RF transmission line 504(2) and RF transmission lines 504(1), 504(3). RF transmission line 504(3) is adjacent to both RF transmission line 504(2) and RF transmission line 504(4) with intervening space between the respective RF transmission line 504(3) and RF transmission lines 504(2), 504(4). RF transmission line 504(4) is adjacent to RF transmission line 504(3) with intervening space between the respective RF transmission line 504(4) and RF transmission line 504(3). These respective adjacent RF transmission lines may be spatially located close enough to each other that EM waves created by the conduction of RF signals in one RF transmission line 504(1)-504(4) create a noise signal in another adjacent RF transmission line 504(1)-504(4).

As shown in FIGS. 5B and 5C, the substrate 500 in this example also includes a plurality of second metallization layers 505(1) that include a second metallization layer 502(2) and third metallization layer 502(3) that are parallel to each other and are located above the first metallization layer 502(1) in the second direction (Z-axis direction). The second metallization layer 502(2) is adjacent to the first metallization layer 502(1) and is between the first metallization layer 502(1) and the third metallization layer 502(3) in the second direction (Z-axis direction). By "adjacent" metallization layers, it is meant that one metallization layer is spatially next to or beside another metallization layer. For example, in this example, third metallization layer 502(3) is adjacent to second metallization layer 502(2) with intervening space therebetween. The second metallization layer 502(2) is adjacent to the first metallization layer 502(1) and RF transmission lines 504(1)-504(4) disposed in the first metallization layer 502(1).

The substrate 500 in this example also includes a plurality of third metallization layers 505(2) that include a fourth metallization layer 502(4) and fifth metallization layer 502(5) that are parallel to each other and that are located below the first metallization layer 502(1) in the second direction (Z-axis direction). The fourth metallization layer 502(4) is directly adjacent to the first metallization layer 502(1) and is between the first metallization layer 502(1) and the fifth metallization layer 502(5) in the second direction (Z-axis direction). The first metallization layer 502(1) is also between the plurality of second metallization layers 505(1) and the plurality of third metallization layers 505(2) in the second direction (Z-axis direction). For example, in this example, fifth metallization layer 502(5) is adjacent to fourth metallization layer 502(4) with intervening space therebetween. The fourth metallization layer 502(4) is adjacent to the first metallization layer 502(1) and RF transmission lines 504(1)-504(4) disposed in the first metallization layer 502(1).

To isolate the RF transmissions lines 504(1)-504(4), the third and fifth metallization layers 502(3), 502(5) are ground planes that are located adjacent to and above and below the RF transmission lines 504(1)-504(4) in the second direction (Z-axis direction). Further, in order to isolate the respective RF transmission lines 504(1)-504(4) from each other, where there may not be enough lateral room in the third direction (Y-axis direction) to form vias to connect to the third and fifth metallization layers 502(3), 502(5) as ground planes, as shown in FIGS. 5B and 5C, respective first conductor loop structures 506(1)(1)-506(1)(3) and second conductor loop structures 506(2)(1)-506(2)(3) are formed in the respective plurality of second metallization layers 505(1) and plurality of third metallization layers 505(2) that operate conceptually like the first and second conductor loops structures 404(1), 404(2) in FIGS. 4A and 4B described above. Note that FIG. 5B shows the first conductor loop structure 506(1)(1) and second conductor loop structures 506(2)(1). FIG. 5C shows the end views of the first conductor loop structures 506(1)(1)-506(1)(3) and second conductor loop structures 506(2)(1)-506(2)(3) which extend in the X-axis direction. Only three (3) first conductor loop structures 506(1)(1)-506(1)(3) and three (3) second conductor loop structures 506(2)(1)-506(2)(3) are provided in this example, because each first conductor loop structure 506(1)(1)-506(1)(3) second conductor loop structure 506(2)(1)-506(2)(3) is disposed between respective adjacent RF transmission lines 504(1)-504(4).

Figure 6A:
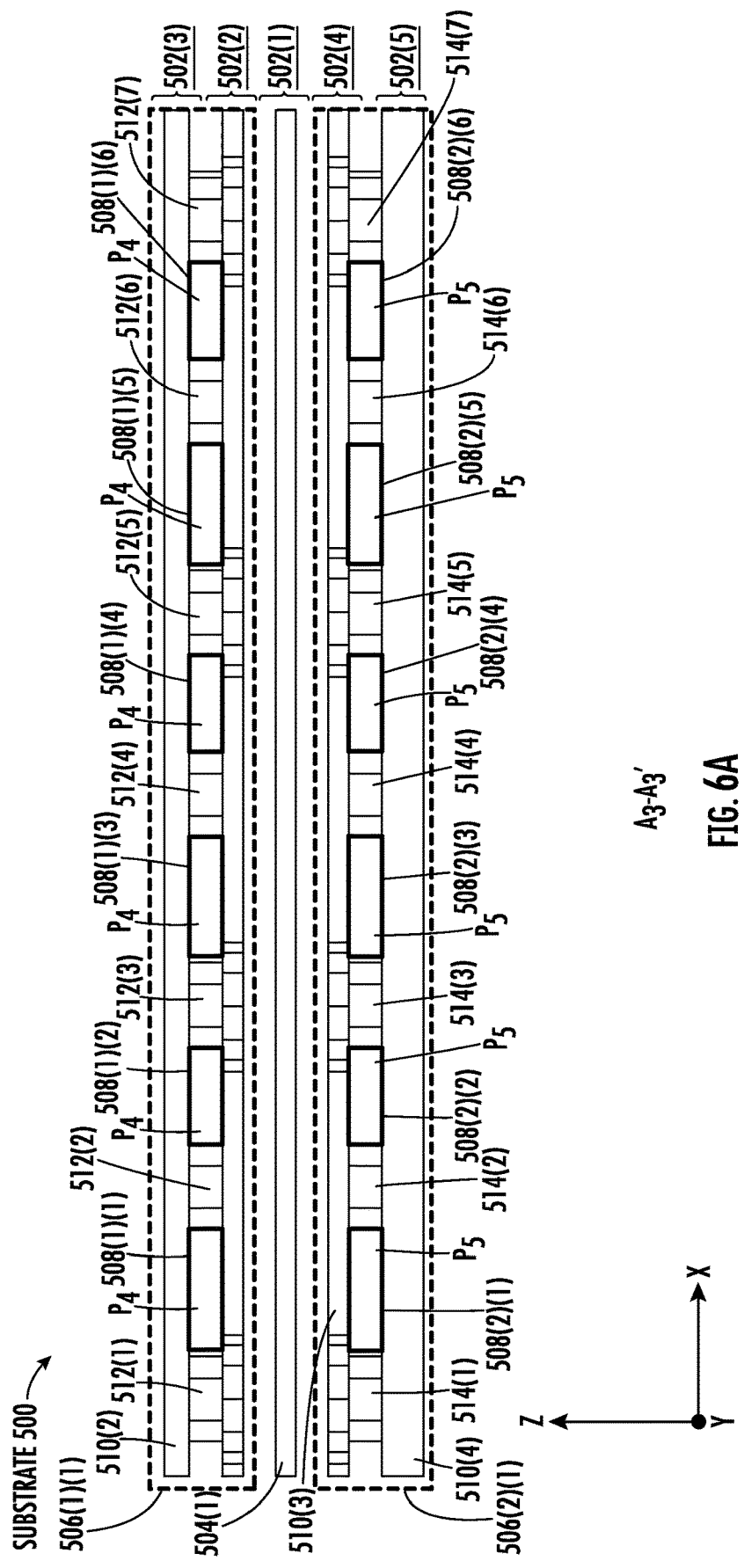
FIGS. 6A and 6B are close-up views of the side and front views, respectively, of the substrate in FIGS. 5B and 5C, respectively.
Figure 6B:
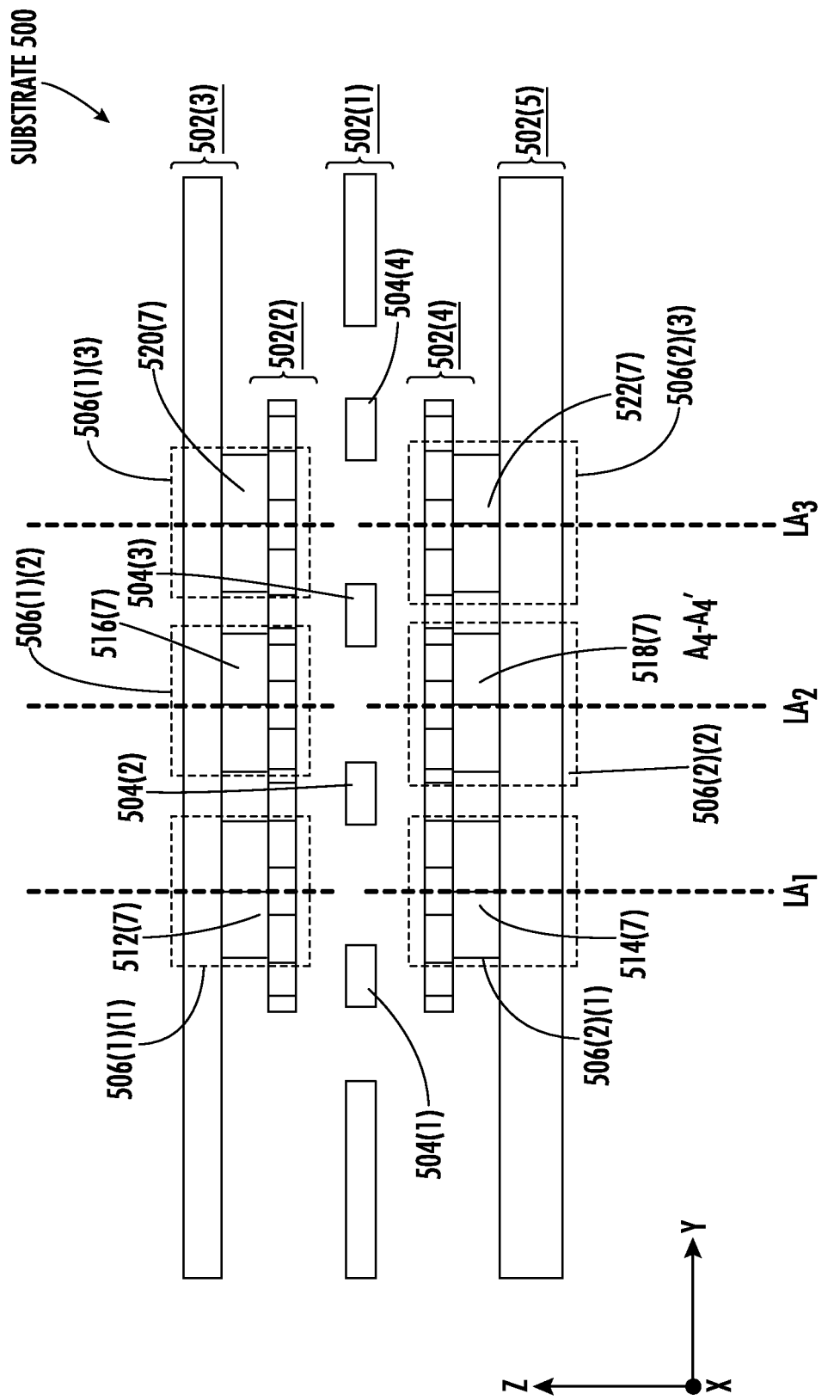

To explain further detail, FIGS. 6A and 6B are provided that are close-up views of FIGS. 5B and 5C, respectively. FIG. 6A shows a first and second conductor loop structure 506(1)(1), 506(2)(1). As shown in FIG. 6A, the first conductor loop structure 506(1)(1) includes six (6) first conductor loops 508(1)(1)-508(1)(6) in this example that are each disposed in a respective plane $P_4$ that is orthogonal to the plane $P_3$ of the first metallization layer 502(1), such that the first conductor loop structure 506(1)(1) is located above the first metallization layer 502(1) and the RF transmission lines 504(1), 504(2) in the second direction (Z-axis direction). This is so that the first conductor loops 508(1)(1)-508(1)(6) are oriented to be able to be penetrated by the magnetic flux of a magnetic field generated as a result of RF signals in adjacent RF transmission lines 504(1), 504(2). The first conductor loops 508(1)(1)-508(1)(6) are adjacent to the RF transmission lines 504(1), 504(2), meaning the first conductor loops 508(1)(1)-508(1)(6) are spatially next to or beside the RF transmission lines 504(1), 504(2). The first conductor loops 508(1)(1)-508(1)(6) are formed by first and second metal lines 510(1), 510(2) parallel to each other and formed in the respective second and third metallization layers 502(2), 502(3) coupled together through vias 512(1)-512(7). In this manner, a closed conductor loop is formed by the metal material of the first and second metal lines 510(1), 510(2) being coupled together with adjacent vias 512(1)-512(7). For example, the first conductor loop 508(1)(1) is formed by vias 512(1), 512(2) being coupled to the first and second metal lines 510(1), 510(2) in the second and third metallization layers 502(2), 502(3). The first conductor loop 508(1)(6) is formed by vias 512(6), 512(7) being coupled to the first and second metal lines 510(1), 510(2) in the second and third metallization layers 502(2), 502(3). Thus, the structures of metal lines and vias that are conventionally formed in substrates to provide routing signal paths can be used in this example to form the first conductor loops 508(1)(1)-508(1)(6) of the first conductive loop structure 506(1)(1).

Further, as also shown in FIG. 6A, the second conductor loop structure 506(2)(1) also includes six (6) second conductor loops 508(2)(1)-508(2)(6) in this example that are each disposed in a respective plane $P_5$ that is orthogonal to the plane $P_3$ of the first metallization layer 502(1). The second conductor loop structure 506(1)(2) is located adjacent to and below the first metallization layer 502(1) and the RF transmission lines 504(1), 504(2) in the second direction (Z-axis direction). This is so that the second conductor loops 508(2)(1)-508(2)(6) are oriented to be able to be penetrated by the magnetic flux of a magnetic field generated as a result of RF signals in the RF transmission lines 504(1), 504(2). The second conductor loops 508(2)(1)-508(2)(6) are also adjacent to the RF transmission lines 504(1), 504(2), but on the other side of the first conductor loops 508(1)(1)-508(1)(6) in the vertical direction (Z-axis direction). The second conductor loops 508(2)(1)-508(2)(6) being adjacent to the RF transmission lines 504(1), 504(2) means the second conductor loops 508(2)(1)-508(2)(6) are spatially next to or beside the RF transmission lines 504(1), 504(2). The second conductor loops 508(2)(1)-508(2)(6) are formed by third and fourth metal lines 510(3), 510(4) parallel to each other and formed in the respective fourth and fifth metallization layers 502(4), 502(5) coupled together through vias 514(1)-514(7). In this manner, a closed conductor loop is formed by the metal material of the third and fourth metal lines 510(3), 510(4) being coupled together with adjacent vias 514(1)-514(7). For example, the second conductor loop 508(2)(1) is formed by vias 514(1), 514(2) being coupled to the third and fourth metal lines 510(3), 510(4) in the fourth and fifth metallization layers 502(4), 502(5). The second conductor loop 508(2)(6) is formed by vias 514(6), 514(7) being coupled to the third and fourth metal lines 510(3), 510(4) in the fourth and fifth metallization layers 502(4), 502(5). Thus, the structures of metal lines and vias that are conventionally formed in substrates to provide routing signal paths can be used in this example to form the second conductor loops 508(2)(1)-508(2)(6) of the second conductive loop structure 506(2)(1).

Note that because of the orientation of FIG. 6A, only the first and second conductor loop structures 506(1)(1), 506(2)(1) that are disposed adjacent to the first and second RF transmission lines 504(1), 504(2) to substantially reduce or cancel induced noise from one RF transmission line 504(1), 504(2) to the other RF transmission line 504(2), 504(1) are shown. However, FIG. 6B shows a cross-sectional front view of the substrate 500 in FIG. 5A across the $A_4$-$A_4$' cross-sectional line. As shown in FIG. 6B, the end side view of the RF transmission lines 504(1)-504(4) are shown. The vias 512(7), 514(7) that are part of the respective first and second conductor loops 508(1)(6), 508(2)(6) in the respective first and second conductive loop structures 506(1)(1), 506(2)(1) are shown. Other vias 516(7), 518(7) that are part of the respective first and second conductor loops in the respective first and second conductive loop structures 506(1)(2), 506(2)(2) that are disposed between respective adjacent RF transmission lines 504(2), 504(3) are shown. Other vias 520(7), 522(7) that are part of the respective first and second conductor loops in the respective first and second conductive loop structures 506(1)(3), 506(2)(3) that are disposed between respective adjacent RF transmission lines 504(3), 504(4) are also shown. In other words, FIG. 6A only shows the first and second conductive loop structures 506(1)(1), 506(2)(1) that are disposed vertically in the second direction (Z-axis direction) between the first and second RF transmission lines 504(1), 504(2), but note that the other first and second conductive loop structures 506(1)(2), 506(2)(2), 506(1)(3), 506(2)(3) are formed like the first and second conductive loop structures 506(1)(1), 506(2)(1) to reduce or cancel noise between respective second and third RF transmission lines 504(2), 504(3), and third and fourth RF transmission lines 504(3), 504(4).

With reference back to FIG. 6A, using the first and second conductor loop structures 506(1)(1), 506(2)(1) as an example, the first and second conductor loop structures 506(1)(1), 506(2)(1) are oriented in this example such that the planes $P_4$, $P_5$ of their respective first and second conductor loops 508(1)(1)-508(2)(6), 508(2)(1)-508(2)(6) are normal to the direction of the magnetic flux of a first magnetic field passing through the first and second conductor loops 508(1)(1)-508(2)(6), 508(2)(1)-508(2)(6) a result of a RF signal in the first and/or second RF transmission lines 504(1), 504(2). Further, in this example, the first and second conductor loop structures 506(1)(1), 506(2)(1) are aligned along longitudinal axis $LA_1$ along the second, vertical direction (Z-axis direction) and offset to be between the RF transmission lines 504(1), 504(2) in the third, lateral direction (Y-axis direction). Eddy currents are induced in the first and second conductor loops 508(1)(1)-508(2)(6), 508(2)(1)-508(2)(6) as a result of the magnetic flux of the first magnetic field penetrating the first and second conductor loops 508(1)(1)-508(2)(6), 508(2)(1)-508(2)(6). These eddy currents flowing in the first and second conductor loops 508(1)(1)-508(2)(6), 508(2)(1)-508(2)(6) then create an induced second magnetic field in the opposite direction of the first magnetic field, which interferes with the first magnetic field, thus creating a magnetic damping force in the first magnetic field that either significantly reduces or cancels the first magnetic field. This has the effect of reducing or canceling the noise induced into one RF transmission line 504(1), 504(2) by another RF transmission line 504(2), 504(1) carrying a RF signal.

Note that the above explanation of the structure and magnetic field operation of the first and second conductor loop structures 506(1)(1), 506(2)(1) is also applicable for the first and second conductor loop structures 506(1)(2), 506(2)(2) regarding the RF transmission lines 504(2), 504(3). The first and second conductor loop structures 506(1)(2), 506(2)(2) are adjacent to the RF transmission lines 504(2), 504(3). The above explanation of the structure and magnetic field operation of the first and second conductor loop structures 506(1)(1), 506(2)(1) is also applicable to the first and second conductor loop structures 506(1)(3), 506(2)(3) regarding the RF transmission lines 504(3), 504(4). The first and second conductor loop structures 506(1)(3), 506(2)(3) are adjacent to the RF transmission lines 504(3), 504(4). The first and second conductor loop structures 506(1)(1), 506(2)(1) are laterally offset in the first direction (X-axis direction) from the respective first and second conductor loop structures 506(1)(2), 506(2)(2). The first and second conductor loop structures 506(1)(2), 506(2)(2) are laterally offset in the first direction (X-axis direction) from the respective first and second conductor loop structures 506(1)(3), 506(2)(3).

Figure 8A:
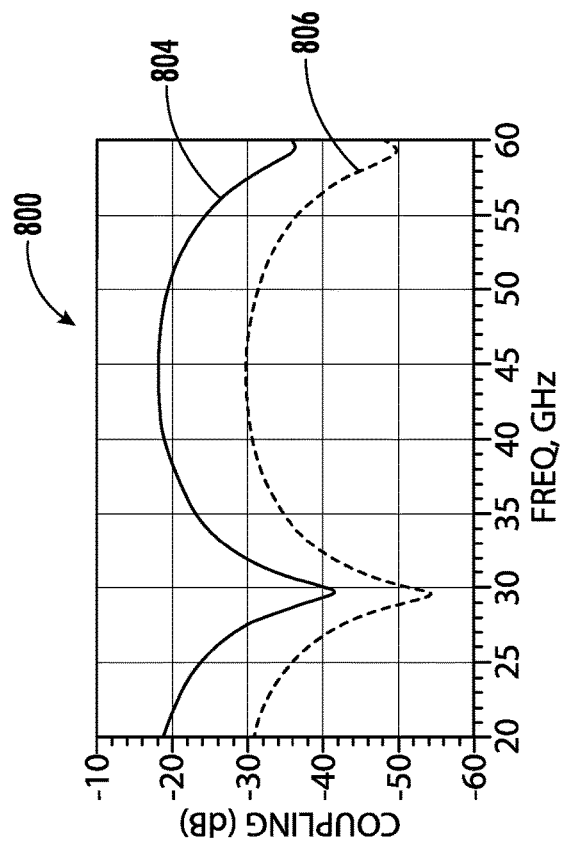
FIGS. 8A and 8B are exemplary graphs of noise coupling between adjacent and non-directly adjacent RF transmission lines in the substrate in FIGS. 5A-5C, respectively, as a function of frequency of RF signals carried in the RF transmission lines.
Figure 8B:
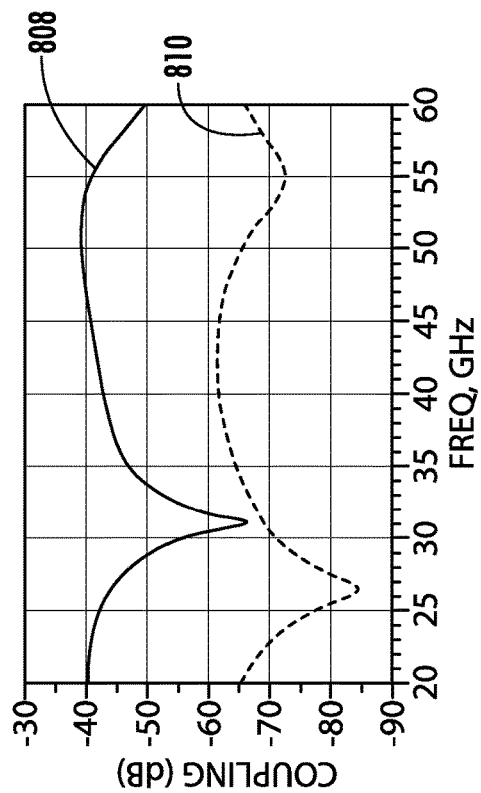
Figure 7:
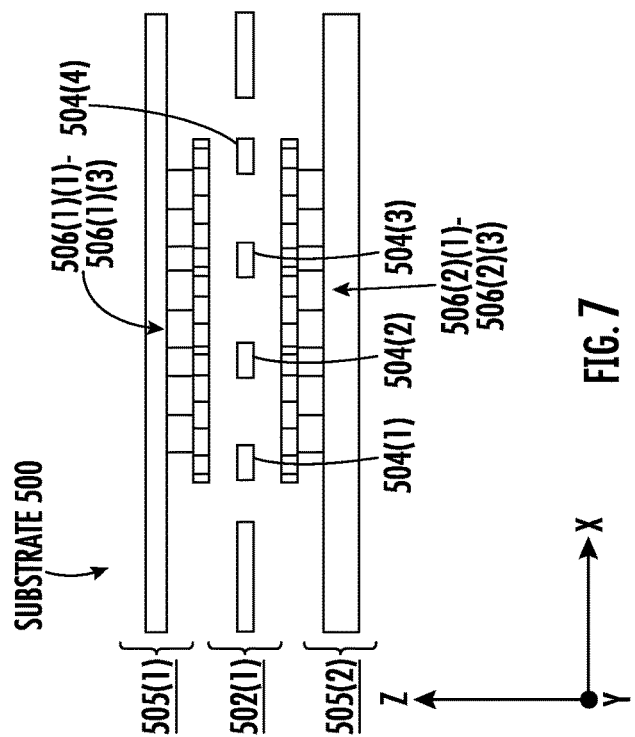
FIG. 7 is FIG. 5C.

FIGS. 8A and 8B are exemplary graphs 800, 802 of noise coupling between RF transmission lines 504(1)-504(4), respectively, in the substrate 500 in FIGS. 5A-5C as a function of frequency of RF signals carried in the RF transmission lines 504(1)-504(4) without and with the conductor loop structures, respectively. The substrate 500 illustrated in FIG. 5C is also shown in FIG. 7 for convenience. Directly adjacent RF transmission lines in the example of the substrate 500 in FIG. 7 are RF transmission lines 504(1), 504(2), RF transmission lines 504(2), 504(3), and RF transmission lines 504(3), 504(4). RF transmission lines that are not directly adjacent to each other in the example of the substrate 500 in FIG. 7 are RF transmission lines 504(1), 504(3) and RF transmission lines 504(2), 504(4). RF transmission line 504(2) is disposed between RF transmission lines 504(1), 504(3), and thus, RF transmission lines 504(1), 504(3) are not directly adjacent to each other. RF transmission line 504(3) is disposed between RF transmission lines 504(2), 504(4), and thus, RF transmission lines 504(2), 504(4) are not directly adjacent to each other.

As shown in the graph 800 in FIG. 8A, curve 804 shows exemplary coupling between adjacent RF transmission lines 504(1)-504(4) as a function of frequency without the inclusion of the conductor loop structures provided as shown in the substrate 500 in FIGS. 5A-5C. Curve 806 in FIG. 8A shows exemplary coupling between adjacent RF transmission lines 504(1)-504(4) as a function of frequency with the inclusion of the conductor loop structures provided as shown in the substrate 500 in FIGS. 5A-5C. As shown in FIG. 8A, the noise coupling is reduced in this example by 12 dB from −18 dB to −30 dB for RF signals at approximately 45 GigaHertz (GHz).

As shown in the graph 802 in FIG. 8B, curve 808 shows exemplary coupling between non-directly adjacent RF transmission lines 504(1)-504(4) as a function of frequency without the inclusion of the conductor loop structures provided as shown in the substrate 500 in FIGS. 5A-5C. Curve 810 in FIG. 8B shows exemplary coupling between non-directly adjacent RF transmission lines 504(1)-504(4) as a function of frequency with the inclusion of the conductor loop structures provided as shown in the substrate 500 in FIGS. 5A-5C. As shown in FIG. 8B, the noise coupling is reduced in this example by 21 dB from −39 dB to −61 dB for RF signals at approximately 45 GigaHertz (GHz).

There are various manners in which a substrate that includes RF transmission lines routed in a first metallization layer, and adjacent upper and lower metallization layers with vertical conductor loops formed therein and adjacent to the RF transmission lines to reduce or cancel the magnetic flux generated by the RF transmission lines, including but not limited to the substrates 102, 500 in FIGS. 1, 5A-5C, 6A-6B, and 7, and that can be included in the antenna module 100 in FIG. 1, can be formed and fabricated.

Figure 9:
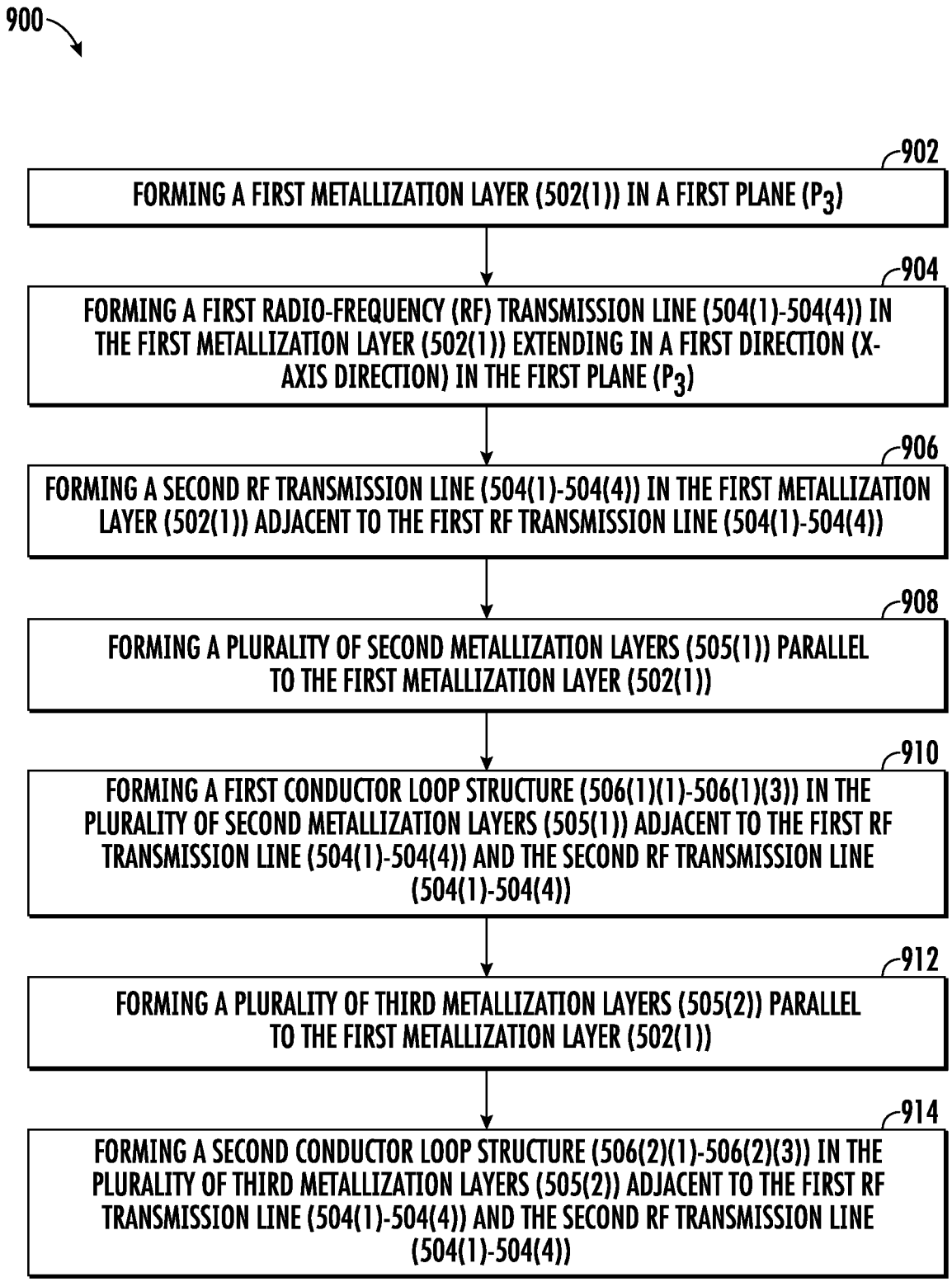
FIG. 9 is a flowchart illustrating an exemplary fabrication process for fabricating a substrate that can be included in an antenna module, including the antenna module in FIG. 1, that includes RF transmission lines routed in a first metallization layer, and upper and lower metallization layers with vertical conductor loops formed therein and to the RF transmission lines to reduce or cancel the magnetic field generated by the RF transmission lines, including but not limited to the substrate in FIGS. 5A-5C, 6A-6B, and 7, and that can be included in the antenna module in FIG. 1.

In this regard, FIG. 9 is a flowchart illustrating an exemplary fabrication process 900 for fabricating a substrate that can be included in an antenna module, including the antenna module 100 in FIG. 1. The substrate can includes RF transmission lines routed in a first metallization layer, and upper and lower metallization layers with vertical conductor loops formed therein and adjacent to the RF transmission lines to reduce or cancel the magnetic field generated by the RF transmission lines, including but not limited to the substrate in FIGS. 5A-5C, 6A-6B, 7A-7E and 8, and that can be included in the antenna module in FIG. 1. The fabrication process 900 will be discussed in conjunction with the substrate 500 in FIGS. 5A-5C, but note that such is not limiting.

In this regard, a first step in the fabrication process 900 can be forming a first metallization layer 502(1) in a first plane $P_3$ (block 902 in FIG. 9). A next step in the fabrication process 900 can be forming a first RF transmission line 504(1)-504(4) in the first metallization layer 502(1) extending in a first direction (X-axis direction) in the first plane $P_3$ (block 904 in FIG. 9). A next step in the fabrication process 900 can be forming a second RF transmission line 504(1)-504(4) in the first metallization layer 502(1) adjacent to the first RF transmission line 504(1)-504(4) (block 906 in FIG. 9). A next step in the fabrication process 900 can be forming a plurality of second metallization layers 505(1) parallel to the first metallization layer 502(1) (block 908 in FIG. 9). A next step in the fabrication process 900 can be forming a first conductor loop structure 506(1)(1)-506(1)(3) in the plurality of second metallization layers 505(1) adjacent to the first RF transmission line 504(1)-504(4) and the second RF transmission line 504(1)-504(4), wherein the first conductor loop structure 506(1)(1)-506(1)(3) comprises one or more first conductor loops 508(1)(1)-508(1)(6) each in a second plane $P_4$ orthogonal to the first plane $P_3$ (block 910 in FIG. 9). A next step in the fabrication process 900 can be forming a plurality of third metallization layers 505(2)) parallel to the first metallization layer 502(1), wherein the first metallization layer 502(1) is between the plurality of second metallization layers 505(1) and the plurality of third metallization layers 505(2) in a second direction (Z-axis direction) orthogonal to the first plane $P_3$ (block 912 in FIG. 9). A next step in the fabrication process 900 can be forming a second conductor loop structure 506(2)(1)-506(2)(3) in the plurality of third metallization layers 505(2) adjacent to the first RF transmission line 504(1)-504(4) and the second RF transmission line 504(1)-504(4), the second conductor loop structure 506(2)(1)-506(2)(3) comprising one or more second conductor loops 508(2)(1)-508(2)(6) each in a third plane $P_5$ orthogonal to the first plane $P_1$ (block 914 in FIG. 9).

Figure 10A:
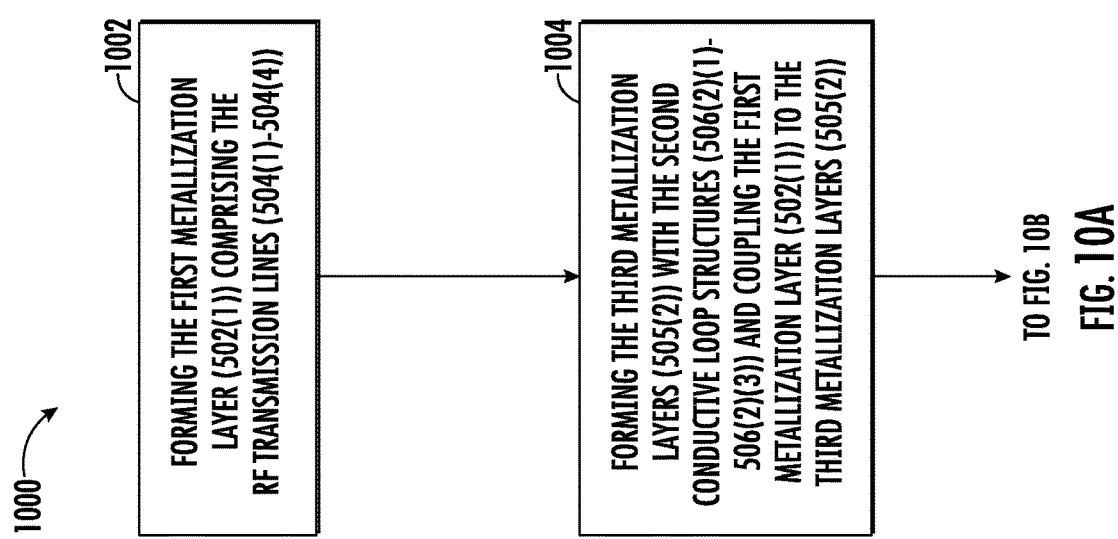
FIGS. 10A-10B is a flowchart illustrating another exemplary fabrication process for fabricating substrate that can be included in an antenna module, including the antenna module in FIG. 1, that includes RF transmission lines routed in a first metallization layer, and upper and lower metallization layers with vertical conductor loops formed therein and to the RF transmission lines to reduce or cancel the magnetic field generated by the RF transmission lines, including but not limited to the substrate in FIGS. 1, 5A-5C, 6A-6B, and 7, and that can be included in the antenna module in FIG. 1.
Figure 10B:
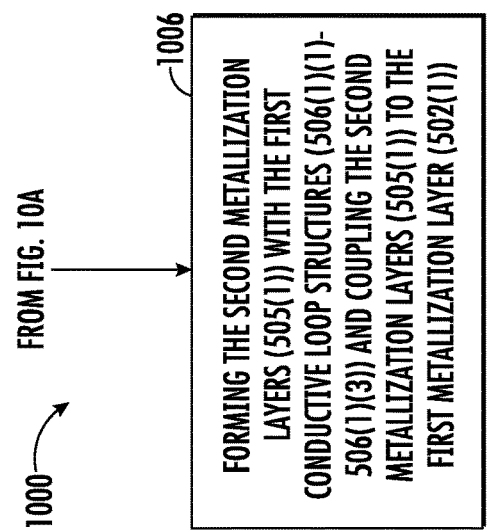

Note as an example, that the fabrication process 900 in FIG. 9 is not required to be in a particular order. For example, is not required to fabricate the RF transmission lines 504(1)-504(4) before the first and second metallization layers 505(1), 505(2) are fabricated. The fabrication process 900 also does not require that the RF transmission lines 504(1)-504(4) be fabricated before the first and second conductor loop structures 506(1)(1)-506(1)(3), 506(2)(1)-506(2)(3) be fabricated in their respective first and second metallization layers 505(1), 505(2). The fabrication process 900 is also not limited to core or coreless substrate fabrication techniques. Other fabrication methods are also possible. For example, FIGS. 10A-10B is a flowchart of another exemplary fabrication process 1000 for fabricating a substrate like substrates 102, 500 in FIGS. 1, 5A-5C, 6A-6B, 7A-7E, and 8, and according to exemplary fabrication stages 1100A-1100C in FIGS. 11A-11C. The fabrication stages 1100A-1100C in FIGS. 11A-11C, according to the exemplary fabrication process 1000 in FIG. 10, will now be discussed in regard to the substrate 500 in FIGS. 5A-5C as an example.

Figure 11A:
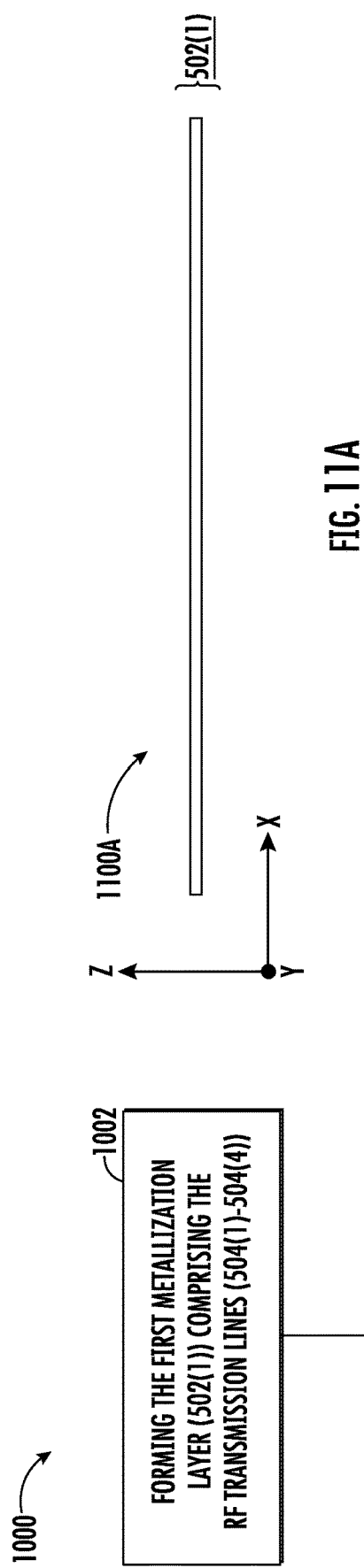
FIGS. 11A-11C illustrate exemplary fabrication stages during fabrication of the substrate fabricated according to the fabrication process in FIGS. 10A-10B.
Figure 11B:
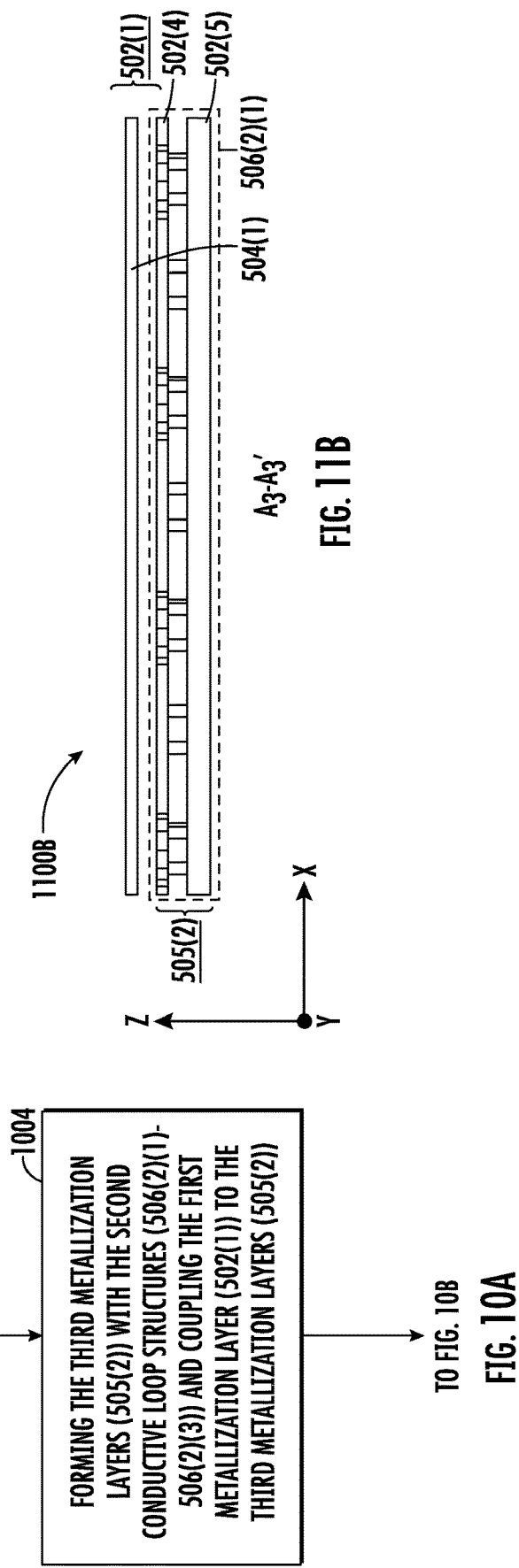
Figure 11C:
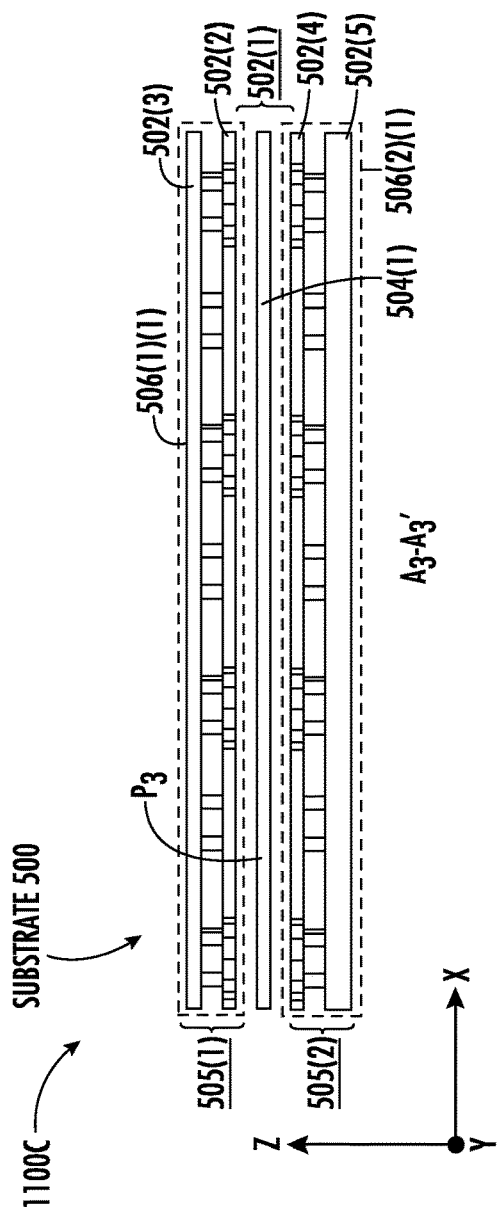

In this regard, as shown in exemplary fabrication stage 1100A in FIG. 11A, a first step in the fabrication process 1000 is forming the first metallization layer 502(1) that includes the RF transmission lines 504(1)-504(2) (block 1002 in FIG. 10A). As shown in exemplary fabrication stage 1100B in FIG. 11B, a next step in the fabrication process 1000 is forming the third metallization layers 505(2) that includes the second conductive loop structures 506(2)(1)-506(2)(3) and coupling the first metallization layer 502(1) to the third metallization layers 505(2) such that the RF transmission lines 504(1)-504(2) are adjacent to the respective second conductive loop structures 506(2)(1)-506(2)(3) (block 1004 in FIG. 10A). As shown in exemplary fabrication stage 1100C in FIG. 11C, a next step in the fabrication process 1000 is forming the second metallization layers 505(1) that includes the first conductive loop structures 506(1)(1)-506(1)(3) and coupling the second metallization layer 505(1) to the first metallization layer 502(1) such that the RF transmission lines 504(1)-504(2) are also adjacent to the respective first conductive loop structures 506(1)(1)-506(1)(3) (block 1006 in FIG. 10B).

An object being "adjacent" as discussed in this application relates to an object being beside or next to another object with intervening space between them. Adjacent objects may not be physically coupled to each other. Directly adjacent objects means that such objects are directly beside or next to each other without another of the objects being intervening or disposed between the directly adjacent objections. Non-directly adjacent objects means that such objects are not directly beside or next to each other without another of the objects being intervening or disposed between the non-directly adjacent objects.

An antenna module that includes a substrate that includes RF transmission lines routed in a first metallization layer, and upper and lower metallization layers with vertical conductor loops formed therein and adjacent to the RF transmission lines to reduce or cancel the magnetic flux generated by the RF transmission lines, including but not limited to the substrates 102, 500 in FIGS. 1, 5A-5C, 6A-6B, 7A-7E, 8, and 12A-12X, and that can be included in the antenna module 100 in FIG. 1, and according to any of the fabrication processes 1000, 1100 in FIGS. 10 and 11A-11C, may be provided in or integrated into any wireless communication device and/or processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SiP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
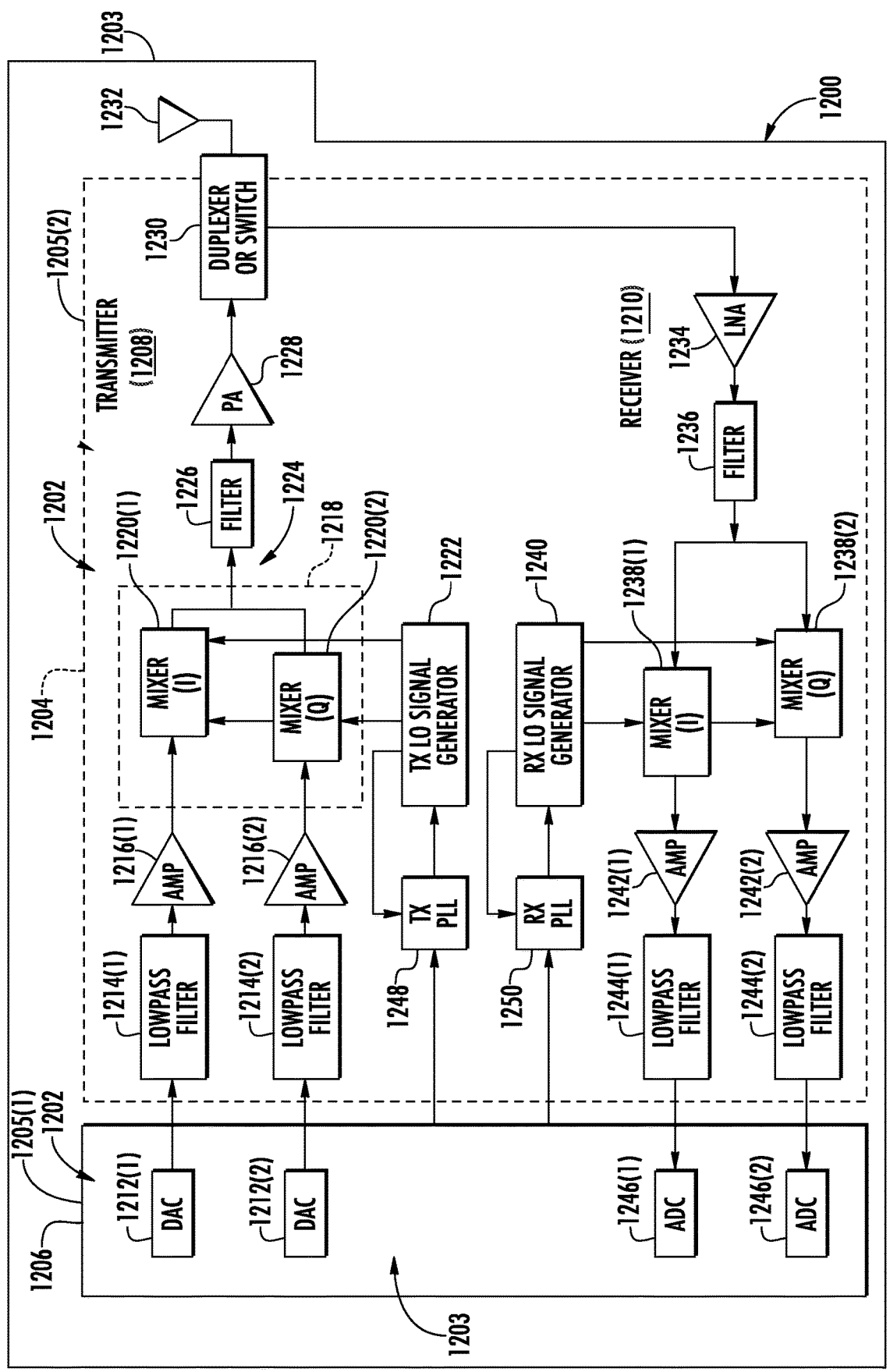
FIG. 12 is a block diagram of an exemplary wireless communications device that includes an antenna module that includes a substrate that includes RF transmission lines routed in a first metallization layer, and upper and lower metallization layers with vertical conductor loops formed therein and to the RF transmission lines to reduce or cancel the magnetic field generated by the RF transmission lines, including but not limited to the substrate in FIGS. 1, 5A-5C, 6A-6B, 7, and 11A-11C, and that can be included in the antenna module in FIG. 1, and according to any of the fabrication processes in FIGS. 9 and 10A-10B.

FIG. 12 illustrates an exemplary wireless communications device 1200 that includes RF components formed from one or more ICs 1202, wherein any of the ICs 1202 can be included in an antenna module 1203. The antenna module 1203 includes a substrate that includes RF transmission lines routed in a first metallization layer, and upper and lower metallization layers with vertical conductor loops formed therein and adjacent to the RF transmission lines to reduce or cancel the magnetic flux generated by the RF transmission lines, including but not limited to the substrate 102, 500 in FIGS. 1, 5A-5C, 6A-6B, 7, and 11A-11C, and that can be included in the antenna module 100 in FIG. 1, and according to any of the fabrication processes 900, 1000 in FIGS. 9 and 10A-10B. As shown in FIG. 12, the wireless communications device 1200 includes a RF transceiver 1204 and a data processor 1206. The components of the RF transceiver and/or data processor 1206 can be split among multiple different die packages 1205(1), 1205(2). The data processor 1206 may include a memory to store data and program codes. The RF transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the RF transceiver 1204 may be implemented on one or more analog ICs, RFICs, mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Downconversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Figure 13:
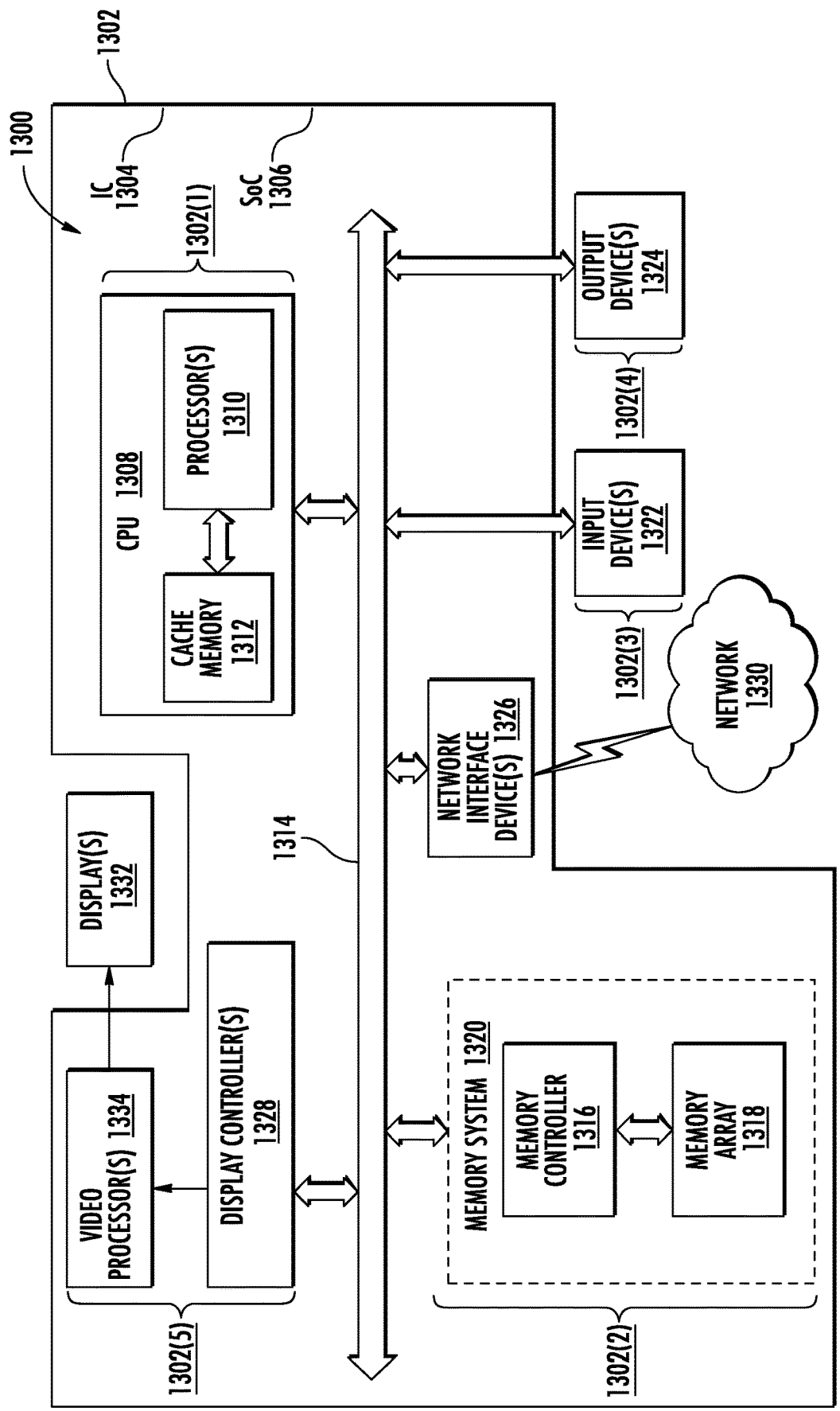
FIG. 13 is a block diagram of an exemplary processor-based system that includes an antenna module that includes a substrate that includes RF transmission lines routed in a first metallization layer, and upper and lower metallization layers with vertical conductor loops formed therein and to the RF transmission lines to reduce or cancel the magnetic field generated by the RF transmission lines, including but not limited to the substrate in FIGS. 1, 5A-5C, 6A-6B, 7, and 11A-11C, and that can be included in the antenna module in FIG. 1, and according to any of the fabrication processes in FIGS. 9 and 10A-10B.

FIG. 13 illustrates an example of a processor-based system 1300 that includes circuits that can be provided in a substrate that includes RF transmission lines routed in a first metallization layer, and upper and lower metallization layers with vertical conductor loops formed therein and adjacent to the RF transmission lines to reduce or cancel the magnetic flux generated by the RF transmission lines, including but not limited to the substrates 102, 500 in FIGS. 1, 5A-5C, 6A-6B, 7, and 11A-11C, and that can be included in the antenna module 100 in FIG. 1, and according to any of the fabrication processes 900, 1000 in FIGS. 9 and 10A-10B. In this example, the processor-based system 1300 may be formed as an IC 1304 in an antenna module 1302 and as a system-on-a-chip (SoC) 1306. The processor-based system 1300 includes a central processing unit (CPU) 1308 that includes one or more processors 1310, which may also be referred to as CPU cores or processor cores. The CPU 1308 may have cache memory 1312 coupled to the CPU 1308 for rapid access to temporarily stored data. The CPU 1308 is coupled to a system bus 1314 and can intercouple master and slave devices included in the processor-based system 1300. As is well known, the CPU 1308 communicates with these other devices by exchanging address, control, and data information over the system bus 1314. For example, the CPU 1308 can communicate bus transaction requests to a memory controller 1316, as an example of a slave device. Although not illustrated in FIG. 13, multiple system buses 1314 could be provided, wherein each system bus 1314 constitutes a different fabric.

Other master and slave devices can be connected to the system bus 1314. As illustrated in FIG. 13, these devices can include a memory system 1320 that can be in a separate antenna module 1302(2) and that includes the memory controller 1316 and a memory array(s) 1318, one or more input devices 1322 (that can be in a separate antenna module 1302(3)), one or more output devices 1324 (that can be in a separate antenna module 1302(4)), one or more network interface devices 1326, and one or more display controllers 1328, as examples. Each of the memory system 1320, the one or more input devices 1322, the one or more output devices 1324, the one or more network interface devices 1326, and the one or more display controllers 1328 can be provided in the same or different antenna modules 1302(5). The input device(s) 1322 can include any type of input device, including, but not limited to, input keys, switches, voice processors, etc. The output device(s) 1324 can include any type of output device, including, but not limited to, audio, video, other visual indicators, etc. The network interface device(s) 1326 can be any device configured to allow exchange of data to and from a network 1330. The network 1330 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1326 can be configured to support any type of communications protocol desired.

The CPU 1308 may also be configured to access the display controller(s) 1328 over the system bus 1314 to control information sent to one or more displays 1332. The display controller(s) 1328 sends information to the display(s) 1332 to be displayed via one or more video processors 1334, which process the information to be displayed into a format suitable for the display(s) 1332. The display controller(s) 1328 and video processor(s) 1334 can be included as ICs in the same or different antenna modules 1302(5), and in the same or different antenna module 1302(1) containing the CPU 1308, as an example. The display(s) 1332 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A substrate, comprising:
   a first metallization layer in a first plane and comprising:
      a first radio-frequency (RF) transmission line extending in a first direction in the first plane; and
      a second RF transmission line adjacent to the first RF transmission line;
   a plurality of second metallization layers parallel to the first metallization layer and comprising:
      a first conductor loop structure adjacent to the first RF transmission line and the second RF transmission line, the first conductor loop structure comprising one or more first conductor loops each in a second plane orthogonal to the first plane; and
   a plurality of third metallization layers parallel to the first metallization layer wherein the first metallization layer is between the plurality of second metallization layers and the plurality of third metallization layers in a second direction orthogonal to the first plane;
   the plurality of third metallization layers, comprising:
      a second conductor loop structure adjacent to the first RF transmission line and the second RF transmission line, the second conductor loop structure comprising one or more second conductor loops each in a third plane orthogonal to the first plane.

2. The substrate of clause 1, wherein the first RF transmission line is configured to generate a magnetic flux in the one or more first conductors loops and in the one or more second conductor loops in response to a RF signal in the first RF transmission line, to induce eddy currents in the one or more first conductor loops and in the one or more second conductor loops that causes a magnetic damping force in the magnetic flux.

3. The substrate of clause 1 or 2, wherein:
   the first conductor loop structure is orthogonal to the first plane of the first metallization layer; and
   the second conductor loop structure is orthogonal to the first plane of the first metallization layer.

4. The substrate of any of clauses 1-3, wherein:
   each of the second planes of the one or more first conductor loops are aligned with the respective third planes of the one or more second conductor loop in the second direction.

5. The substrate of any of clauses 1-4, wherein:
   the plurality of second metallization layers are adjacent to the first metallization layer; and
   the plurality of third metallization layers are adjacent to the first metallization layer.

6. The substrate of any of clauses 1-5, wherein:
   the plurality of second metallization layers comprises:
      a second metallization layer adjacent to the first metallization layer and comprising a second metal line;
      a third metallization layer adjacent to the second metallization layer and comprising a third metal line parallel to the second metal line; and
      a plurality of first vias each coupling the second metal line to the third metal line to form the one or more first conductor loops of the first conductor loop structure; and
   the plurality of third metallization layers comprises:
      a fourth metallization layer adjacent to the first metallization layer and comprising a fourth metal line;
      a fifth metallization layer adjacent to the fourth metallization layer and comprising a fifth metal line parallel to the fourth metal line; and
      a plurality of second vias each coupling the fourth metal line to the fifth metal line to form the one or more second conductor loops of the second conductor loop structure.

7. The substrate of clause 6, wherein:
the second metallization layer is between the first metallization layer and the third metallization layer in the second direction; and
the fourth metallization layer is between the first metallization layer and the fifth metallization layer in the second direction.

8 The substrate of clause 1, wherein:
the first metallization layer further comprises:
   a third RF transmission line; and
   a fourth RF transmission line adjacent to the third RF transmission line;
the plurality of second metallization layers further comprises:
   a third conductor loop structure adjacent to the third RF transmission line and the fourth RF transmission line, the third conductor loop structure comprising one or more third conductor loops each in a fourth plane orthogonal to the first plane; and
the plurality of third metallization layers further comprises:
   a fourth conductor loop structure adjacent to the third RF transmission line and the fourth RF transmission line, the fourth conductor loop structure comprising one or more fourth conductor loops each in a fifth plane orthogonal to the first plane.

9. The substrate of clause 8, wherein:
each of the second planes of one or more first conductor loops are aligned with the third planes of the one or more second conductor loops in the second direction;
each of the fourth planes of one or more third conductor loops are aligned with the fifth planes of the one or more fourth conductor loops in the second direction;
the first conductor loop structure is laterally offset from the third conductor loop structure in the first direction; and
the second conductor loop structure is laterally offset from the fourth conductor loop structure in the first direction.

10. The substrate of clause 8 or 9, wherein:
the plurality of second metallization layers comprises:
   a second metallization layer adjacent to the first metallization layer and comprising a second metal line and a fourth metal line parallel to the second metal line;
   a third metallization layer adjacent to the second metallization layer and comprising a third metal line parallel to the second metal line and a fifth metal line parallel to the third metal line;
   a plurality of first vias each coupling the second metal line to the third metal line to form the one or more first conductor loops of the first conductor loop structure; and
   a plurality of second vias each coupling the fourth metal line to the fifth metal line to form the one or more second conductor loops of the second conductor loop structure; and the plurality of third metallization layers comprises:
  a fourth metallization layer adjacent to the first metallization layer and comprising a sixth metal line and an eighth metal line parallel to the sixth metal line;
  a fifth metallization layer adjacent to the fourth metallization layer and comprising a seventh metal line parallel to the sixth metal line and a ninth metal line parallel to the seventh metal line;
  a plurality of third vias each coupling the sixth metal line to the eighth metal line to form the one or more third conductor loops of the third conductor loop structure; and
  a plurality of fourth vias each coupling the seventh metal line to the ninth metal line to form the one or more fourth conductor loops of the fourth conductor loop structure.

11. The substrate of any of clauses 1-10, wherein the second RF transmission line is parallel to the first RF transmission line.

12. The substrate of any of clauses 1-11, wherein:
  the plurality of second metallization layers further comprises a first ground plane;
  the first conductor loop structure is coupled to the first ground plane;
  the plurality of third metallization layers further comprises a second ground plane; and
  the second conductor loop structure is coupled to the second ground plane.

13. The substrate of clause 12, further comprising one or more metal interconnects coupling the first ground plane to the second ground plane.

14. The substrate of any of clauses 1-13, wherein the first RF transmission line and the second RF transmission line are disposed in the first metallization layer at a first pitch less than or equal to 100 micrometers (μm).

15. The substrate of any of clauses 1-14 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SiP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating a substrate, comprising:
  forming a first metallization layer in a first plane;
  forming a first radio-frequency (RF) transmission line in the first metallization layer extending in a first direction in the first plane;
  forming a second RF transmission line in the first metallization layer adjacent to the first RF transmission line;
  forming a plurality of second metallization layers parallel to the first metallization layer;
  forming a first conductor loop structure adjacent in the plurality of second metallization layers to the first RF transmission line and the second RF transmission line, the first conductor loop structure comprising one or more first conductor loops each in a second plane orthogonal to the first plane;
  forming a plurality of third metallization layers parallel to the first metallization layer wherein the first metallization layer is between the plurality of second metallization layers and the plurality of third metallization layers in a second direction orthogonal to the first plane; and
  forming a second conductor loop structure in the plurality of third metallization layers adjacent to the first RF transmission line and the second RF transmission line, the second conductor loop structure comprising one or more second conductor loops each in a third plane orthogonal to the first plane.

17. The method of clause 16, wherein:
  forming the first conductor loop structure further comprises forming the first conductor loop structure orthogonal to the first plane of the first metallization layer; and
  forming the first conductor loop structure further comprises forming the second conductor loop structure is orthogonal to the first plane of the first metallization layer.

18. The method of clause 16 or 17, wherein forming the first conductor loop structure further comprises aligning each of the second planes of the one or more first conductor loops with the respective third planes of the one or more second conductor loop in the second direction.

19. The method of any of clauses 16-18, wherein:
  forming the plurality of second metallization layers further comprises forming the plurality of second metallization layers adjacent to the first metallization layer; and
  forming the plurality of third metallization layers further comprises forming the plurality of third metallization layers adjacent to the first metallization layer.

20 The method of any of clauses 16-19, wherein:
  forming the plurality of second metallization layers comprises:
    forming a second metallization layer adjacent to the first metallization layer and comprising a second metal line;
    forming a third metallization layer adjacent to the second metallization layer and comprising a third metal line parallel to the second metal line; and
    forming a plurality of first vias each coupling the second metal line to the third metal line to form the one or more first conductor loops of the first conductor loop structure; and
  forming the plurality of third metallization layers comprises:
    forming a fourth metallization layer adjacent to the first metallization layer and comprising a fourth metal line;
    forming a fifth metallization layer adjacent to the fourth metallization layer and comprising a fifth metal line parallel to the fourth metal line; and
    forming a plurality of second vias each coupling the fourth metal line to the fifth metal line to form the one or more second conductor loops of the second conductor loop structure.

21. The method of any of clauses 16-20, wherein:
  forming the first metallization layer further comprises:
    forming a third RF transmission line; and
    forming a fourth RF transmission line adjacent to the third RF transmission line;
  forming the plurality of second metallization layers further comprises:
    forming a third conductor loop structure adjacent to the third RF transmission line and the fourth RF transmission line, the third conductor loop structure comprising one or more third conductor loops each in a fourth plane orthogonal to the first plane; and forming the plurality of third metallization layers further comprises:
   forming a fourth conductor loop structure adjacent to the third RF transmission line and the fourth RF transmission line, the fourth conductor loop structure comprising one or more fourth conductor loops each in a fifth plane orthogonal to the first plane.

22. The method of clause 21, wherein:
forming the first conductor loop structure further comprises aligning each of the second planes of one or more first conductor loops with the third planes of the one or more second conductor loops in the second direction; and forming the third conductor loop structure further comprises aligning each of the fourth planes of one or more third conductor loops with the fifth planes of the one or more fourth conductor loops in the second direction;

wherein:
   the first conductor loop structure is laterally offset from the third conductor loop structure in the first direction; and
   the second conductor loop structure is laterally offset from the fourth conductor loop structure in the first direction.

23. An antenna module, comprising:
a substrate, comprising:
   an antenna substrate comprising one or more antennas; and
   a package substrate coupled to the antenna substrate; and
an integrated circuit (IC) die layer comprising a first die comprising a plurality of first die interconnects coupled to the package substrate;
the substrate comprising:
   a first metallization layer in a first plane and comprising:
      a first radio-frequency (RF) transmission line extending in a first direction in the first plane, the first RF transmission line coupled to a first antenna of the one or more antennas; and
      a second RF transmission line adjacent to the first RF transmission line, the second RF transmission line coupled to a second antenna of the one or more antennas;
   a plurality of second metallization layers parallel to the first metallization layer and comprising:
      a first conductor loop structure adjacent to the first RF transmission line and the second RF transmission line, the first conductor loop structure comprising one or more first conductor loops each in a second plane orthogonal to the first plane; and
   a plurality of third metallization layers parallel to the first metallization layer wherein the first metallization layer is between the plurality of second metallization layers and the plurality of third metallization layers in a second direction orthogonal to the first plane;
   the plurality of third metallization layers, comprising:
      a second conductor loop structure adjacent to the first RF transmission line and the second RF transmission line, the second conductor loop structure comprising one or more second conductor; and
      the plurality of first die interconnects coupled to the first RF transmission line and the second RF transmission line.

24. The antenna module of clause 23, wherein the first RF transmission line is configured to generate a magnetic flux in the one or more first conductors loops and in the one or more second conductor loops in response to a RF signal in the first RF transmission line, to induce eddy currents in the one or more first conductor loops and in the one or more second conductor loops that causes a magnetic damping force in the magnetic flux.

25. The antenna module of clause 23 or 24, wherein:
the plurality of second metallization layers comprises:
   a second metallization layer adjacent to the first metallization layer and comprising a second metal line;
   a third metallization layer adjacent to the second metallization layer and comprising a third metal line parallel to the second metal line; and
   a plurality of first vias each coupling the second metal line to the third metal line to form the one or more first conductor loops of the first conductor loop structure; and
the plurality of third metallization layers comprises:
   a fourth metallization layer adjacent to the first metallization layer and comprising a fourth metal line;
   a fifth metallization layer adjacent to the fourth metallization layer and comprising a fifth metal line parallel to the fourth metal line; and
   a plurality of second vias each coupling the fourth metal line to the fifth metal line to form the one or more second conductor loops of the second conductor loop structure.

26 The antenna module of clause 25, wherein:
the second metallization layer is between the first metallization layer and the third metallization layer in the second direction; and
the fourth metallization layer is between the first metallization layer and the fifth metallization layer in the second direction.

27 The antenna module of any of clauses 23-26, wherein:
the plurality of second metallization layers further comprises a first ground plane;
the first conductor loop structure is coupled to the first ground plane;
the plurality of third metallization layers further comprises a second ground plane; and
the second conductor loop structure is coupled to the second ground plane.

28. The antenna module of any of clauses 23-27 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SiP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

What is claimed is:

1. A substrate, comprising:
 a first metallization layer in a first plane and comprising:
  a first radio-frequency (RF) transmission line extending in a first direction in the first plane; and
  a second RF transmission line adjacent to the first RF transmission line;
 a plurality of second metallization layers parallel to the first metallization layer and comprising:
  a first conductor loop structure adjacent to the first RF transmission line and the second RF transmission line, the first conductor loop structure comprising one or more first conductor loops each in a second plane orthogonal to the first plane; and
 a plurality of third metallization layers parallel to the first metallization layer wherein the first metallization layer is between the plurality of second metallization layers and the plurality of third metallization layers in a second direction orthogonal to the first plane;
 the plurality of third metallization layers, comprising:
  a second conductor loop structure adjacent to the first RF transmission line and the second RF transmission line, the second conductor loop structure comprising one or more second conductor loops each in a third plane orthogonal to the first plane.

2. The substrate of claim 1, wherein the first RF transmission line is configured to generate a magnetic flux in the one or more first conductors loops and in the one or more second conductor loops in response to a RF signal in the first RF transmission line, to induce eddy currents in the one or more first conductor loops and in the one or more second conductor loops that causes a magnetic damping force in the magnetic flux.

3. The substrate of claim 1, wherein:
 the first conductor loop structure is orthogonal to the first plane of the first metallization layer; and
 the second conductor loop structure is orthogonal to the first plane of the first metallization layer.

4. The substrate of claim 1, wherein:
 each of the second planes of the one or more first conductor loops are aligned with the respective third planes of the one or more second conductor loop in the second direction.

5. The substrate of claim 1, wherein:
 the plurality of second metallization layers are adjacent to the first metallization layer; and
 the plurality of third metallization layers are adjacent to the first metallization layer.

6. The substrate of claim 1, wherein:
 the plurality of second metallization layers comprises:
  a second metallization layer adjacent to the first metallization layer and comprising a second metal line;
  a third metallization layer adjacent to the second metallization layer and comprising a third metal line parallel to the second metal line; and
  a plurality of first vias each coupling the second metal line to the third metal line to form the one or more first conductor loops of the first conductor loop structure; and
 the plurality of third metallization layers comprises:
  a fourth metallization layer adjacent to the first metallization layer and comprising a fourth metal line;
  a fifth metallization layer adjacent to the fourth metallization layer and comprising a fifth metal line parallel to the fourth metal line; and
  a plurality of second vias each coupling the fourth metal line to the fifth metal line to form the one or more second conductor loops of the second conductor loop structure.

7. The substrate of claim 6, wherein:
 the second metallization layer is between the first metallization layer and the third metallization layer in the second direction; and
 the fourth metallization layer is between the first metallization layer and the fifth metallization layer in the second direction.

8. The substrate of claim 1, wherein:
 the first metallization layer further comprises:
  a third RF transmission line; and
  a fourth RF transmission line adjacent to the third RF transmission line;
 the plurality of second metallization layers further comprises:
  a third conductor loop structure adjacent to the third RF transmission line and the fourth RF transmission line, the third conductor loop structure comprising one or more third conductor loops each in a fourth plane orthogonal to the first plane; and
 the plurality of third metallization layers further comprises:
  a fourth conductor loop structure adjacent to the third RF transmission line and the fourth RF transmission line, the fourth conductor loop structure comprising one or more fourth conductor loops each in a fifth plane orthogonal to the first plane.

9. The substrate of claim 8, wherein:
 each of the second planes of one or more first conductor loops are aligned with the third planes of the one or more second conductor loops in the second direction;
 each of the fourth planes of one or more third conductor loops are aligned with the fifth planes of the one or more fourth conductor loops in the second direction;
 the first conductor loop structure is laterally offset from the third conductor loop structure in the first direction; and
 the second conductor loop structure is laterally offset from the fourth conductor loop structure in the first direction.

10. The substrate of claim 8, wherein:
 the plurality of second metallization layers comprises:
  a second metallization layer adjacent to the first metallization layer and comprising a second metal line and a fourth metal line parallel to the second metal line;
  a third metallization layer adjacent to the second metallization layer and comprising a third metal line parallel to the second metal line and a fifth metal line parallel to the third metal line;
  a plurality of first vias each coupling the second metal line to the third metal line to form the one or more first conductor loops of the first conductor loop structure; and
  a plurality of second vias each coupling the fourth metal line to the fifth metal line to form the one or more second conductor loops of the second conductor loop structure; and
 the plurality of third metallization layers comprises:
  a fourth metallization layer adjacent to the first metallization layer and comprising a sixth metal line and an eighth metal line parallel to the sixth metal line;
  a fifth metallization layer adjacent to the fourth metallization layer and comprising a seventh metal line parallel to the sixth metal line and a ninth metal line parallel to the seventh metal line;

a plurality of third vias each coupling the sixth metal line to the eighth metal line to form the one or more third conductor loops of the third conductor loop structure; and a plurality of fourth vias each coupling the seventh metal line to the ninth metal line to form the one or more fourth conductor loops of the fourth conductor loop structure.

11. The substrate of claim 1, wherein the second RF transmission line is parallel to the first RF transmission line.

12. The substrate of claim 1, wherein:
the plurality of second metallization layers further comprises a first ground plane;
the first conductor loop structure is coupled to the first ground plane;
the plurality of third metallization layers further comprises a second ground plane; and
the second conductor loop structure is coupled to the second ground plane.

13. The substrate of claim 12, further comprising one or more metal interconnects coupling the first ground plane to the second ground plane.

14. The substrate of claim 1, wherein the first RF transmission line and the second RF transmission line are disposed in the first metallization layer at a first pitch less than or equal to 100 micrometers (μm).

15. The substrate of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SiP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating a substrate, comprising:
forming a first metallization layer in a first plane;
forming a first radio-frequency (RF) transmission line in the first metallization layer extending in a first direction in the first plane;
forming a second RF transmission line in the first metallization layer adjacent to the first RF transmission line;
forming a plurality of second metallization layers parallel to the first metallization layer;
forming a first conductor loop structure adjacent in the plurality of second metallization layers to the first RF transmission line and the second RF transmission line, the first conductor loop structure comprising one or more first conductor loops each in a second plane orthogonal to the first plane;
forming a plurality of third metallization layers parallel to the first metallization layer wherein the first metallization layer is between the plurality of second metallization layers and the plurality of third metallization layers in a second direction orthogonal to the first plane; and
forming a second conductor loop structure in the plurality of third metallization layers adjacent to the first RF transmission line and the second RF transmission line, the second conductor loop structure comprising one or more second conductor loops each in a third plane orthogonal to the first plane.

17. The method of claim 16, wherein:
forming the first conductor loop structure further comprises forming the first conductor loop structure orthogonal to the first plane of the first metallization layer; and
forming the first conductor loop structure further comprises forming the second conductor loop structure is orthogonal to the first plane of the first metallization layer.

18. The method of claim 16, wherein forming the first conductor loop structure further comprises aligning each of the second planes of the one or more first conductor loops with the respective third planes of the one or more second conductor loop in the second direction.

19. The method of claim 16, wherein:
forming the plurality of second metallization layers further comprises forming the plurality of second metallization layers adjacent to the first metallization layer; and
forming the plurality of third metallization layers further comprises forming the plurality of third metallization layers adjacent to the first metallization layer.

20. The method of claim 16, wherein:
forming the plurality of second metallization layers comprises:
forming a second metallization layer adjacent to the first metallization layer and comprising a second metal line;
forming a third metallization layer adjacent to the second metallization layer and comprising a third metal line parallel to the second metal line; and
forming a plurality of first vias each coupling the second metal line to the third metal line to form the one or more first conductor loops of the first conductor loop structure; and
forming the plurality of third metallization layers comprises:
forming a fourth metallization layer adjacent to the first metallization layer and comprising a fourth metal line;
forming a fifth metallization layer adjacent to the fourth metallization layer and comprising a fifth metal line parallel to the fourth metal line; and
forming a plurality of second vias each coupling the fourth metal line to the fifth metal line to form the one or more second conductor loops of the second conductor loop structure.

21. The method of claim 16, wherein:
forming the first metallization layer further comprises:
forming a third RF transmission line; and
forming a fourth RF transmission line adjacent to the third RF transmission line;
forming the plurality of second metallization layers further comprises:
forming a third conductor loop structure adjacent to the third RF transmission line and the fourth RF transmission line, the third conductor loop structure comprising one or more third conductor loops each in a fourth plane orthogonal to the first plane; and
forming the plurality of third metallization layers further comprises:
forming a fourth conductor loop structure adjacent to the third RF transmission line and the fourth RF transmission line, the fourth conductor loop structure comprising one or more fourth conductor loops each in a fifth plane orthogonal to the first plane.

22. The method of claim 21, wherein:
forming the first conductor loop structure further comprises aligning each of the second planes of one or more first conductor loops with the third planes of the one or more second conductor loops in the second direction; and
forming the third conductor loop structure further comprises aligning each of the fourth planes of one or more third conductor loops with the fifth planes of the one or more fourth conductor loops in the second direction; wherein:
the first conductor loop structure is laterally offset from the third conductor loop structure in the first direction; and
the second conductor loop structure is laterally offset from the fourth conductor loop structure in the first direction.

23. An antenna module, comprising:
a substrate, comprising:
an antenna substrate comprising one or more antennas; and
a package substrate coupled to the antenna substrate; and
an integrated circuit (IC) die layer comprising a first die comprising a plurality of first die interconnects coupled to the package substrate;
the substrate comprising:
a first metallization layer in a first plane and comprising:
a first radio-frequency (RF) transmission line extending in a first direction in the first plane, the first RF transmission line coupled to a first antenna of the one or more antennas; and
a second RF transmission line adjacent to the first RF transmission line, the second RF transmission line coupled to a second antenna of the one or more antennas;
a plurality of second metallization layers parallel to the first metallization layer and comprising:
a first conductor loop structure adjacent to the first RF transmission line and the second RF transmission line, the first conductor loop structure comprising one or more first conductor loops each in a second plane orthogonal to the first plane; and
a plurality of third metallization layers parallel to the first metallization layer wherein the first metallization layer is between the plurality of second metallization layers and the plurality of third metallization layers in a second direction orthogonal to the first plane;
the plurality of third metallization layers, comprising:
a second conductor loop structure adjacent to the first RF transmission line and the second RF transmission line, the second conductor loop structure comprising one or more second conductor; and
the plurality of first die interconnects coupled to the first RF transmission line and the second RF transmission line.

24. The antenna module of claim 23, wherein the first RF transmission line is configured to generate a magnetic flux in the one or more first conductors loops and in the one or more second conductor loops in response to a RF signal in the first RF transmission line, to induce eddy currents in the one or more first conductor loops and in the one or more second conductor loops that causes a magnetic damping force in the magnetic flux.

25. The antenna module of claim 23, wherein:
the plurality of second metallization layers comprises:
a second metallization layer adjacent to the first metallization layer and comprising a second metal line;
a third metallization layer adjacent to the second metallization layer and comprising a third metal line parallel to the second metal line; and
a plurality of first vias each coupling the second metal line to the third metal line to form the one or more first conductor loops of the first conductor loop structure; and
the plurality of third metallization layers comprises:
a fourth metallization layer adjacent to the first metallization layer and comprising a fourth metal line;
a fifth metallization layer adjacent to the fourth metallization layer and comprising a fifth metal line parallel to the fourth metal line; and
a plurality of second vias each coupling the fourth metal line to the fifth metal line to form the one or more second conductor loops of the second conductor loop structure.

26. The antenna module of claim 25, wherein:
the second metallization layer is between the first metallization layer and the third metallization layer in the second direction; and
the fourth metallization layer is between the first metallization layer and the fifth metallization layer in the second direction.

27. The antenna module of claim 23, wherein:
the plurality of second metallization layers further comprises a first ground plane;
the first conductor loop structure is coupled to the first ground plane;
the plurality of third metallization layers further comprises a second ground plane; and
the second conductor loop structure is coupled to the second ground plane.

28. The antenna module of claim 23 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SiP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *